US012212115B2

(12) United States Patent
Samonji et al.

(10) Patent No.: US 12,212,115 B2
(45) Date of Patent: Jan. 28, 2025

(54) SEMICONDUCTOR LIGHT-EMITTING APPARATUS AND METHOD OF FABRICATING SEMICONDUCTOR LIGHT-EMITTING APPARATUS

(71) Applicant: NUVOTON TECHNOLOGY CORPORATION JAPAN, Kyoto (JP)

(72) Inventors: Katsuya Samonji, Toyama (JP); Tohru Nishikawa, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 445 days.

(21) Appl. No.: 17/170,630

(22) Filed: Feb. 8, 2021

(65) Prior Publication Data

US 2021/0159663 A1    May 27, 2021

Related U.S. Application Data

(63) Continuation of application No. PCT/JP2019/030656, filed on Aug. 5, 2019.

(30) Foreign Application Priority Data

Aug. 9, 2018    (JP) .................................. 2018-150095

(51) Int. Cl.
*H01S 5/02* (2006.01)
*H01S 5/0231* (2021.01)
(Continued)

(52) U.S. Cl.
CPC .......... *H01S 5/0216* (2013.01); *H01S 5/0231* (2021.01); *H01S 5/0239* (2021.01); *H01S 5/02476* (2013.01)

(58) Field of Classification Search
CPC ............ H01S 5/02476; H01S 5/02469; H01S 5/02315; H01S 5/023; H01S 5/0236;
(Continued)

(56) References Cited

U.S. PATENT DOCUMENTS

2001/0048698 A1    12/2001   Lorenzen et al.
2003/0174954 A1     9/2003   Hamamoto et al.
(Continued)

FOREIGN PATENT DOCUMENTS

CN        107293936      * 10/2017    .......... H01S 5/4025
JP       H08-248258 A      9/1996
(Continued)

OTHER PUBLICATIONS

Rong An, et al., "Determination of the Elastic Properties of Au5Sn and AuSn from Ab Initio Calculations", Journal of Electronic Materials, vol. 37, No. 7, 2008, pp. 968-974 (Year: 2008).*
(Continued)

*Primary Examiner* — Tod T Van Roy
*Assistant Examiner* — Delma R Forde
(74) *Attorney, Agent, or Firm* — Rimon P.C.

(57) ABSTRACT

Semiconductor light-emitting apparatus includes substrate, submount above substrate, and semiconductor laser above submount. Semiconductor laser and submount are bonded to each other with first bonding material. Substrate and submount are bonded to each other with second bonding material. Submount has first region and second region near substrate, first region being a region on which spacer is disposed, and second region being a region without spacer. Submount is bonded to substrate by covering at least a portion of second region with second bonding material.

27 Claims, 23 Drawing Sheets

(51) Int. Cl.
*H01S 5/0239* (2021.01)
*H01S 5/024* (2006.01)

(58) Field of Classification Search
CPC .. H01S 5/024; H01S 5/02484; H01S 5/02492; H01S 5/0234; H01S 5/0235–0237
See application file for complete search history.

(56) References Cited

U.S. PATENT DOCUMENTS

| | | |
|---|---|---|
| 2005/0041934 A1 | 2/2005 | Zama et al. |
| 2009/0104727 A1 | 4/2009 | Krejci et al. |
| 2011/0007762 A1 | 1/2011 | Fukuda et al. |
| 2011/0090927 A1 | 4/2011 | Wong et al. |
| 2012/0140496 A1 | 6/2012 | Kishimoto et al. |
| 2016/0093786 A1 | 3/2016 | Hosotani |
| 2018/0040792 A1 | 2/2018 | Kawabata et al. |
| 2018/0159006 A1 | 6/2018 | Hayashi et al. |
| 2019/0006818 A1 | 1/2019 | Minato et al. |

FOREIGN PATENT DOCUMENTS

| | | |
|---|---|---|
| JP | H11-214791 A | 8/1999 |
| JP | 2000-068583 A | 3/2000 |
| JP | 2003-215408 A | 7/2003 |
| JP | 2003-273462 A | 9/2003 |
| JP | 2005-223083 A | 8/2005 |
| JP | 2005-259851 A | 9/2005 |
| JP | 2006-351847 A | 12/2006 |
| JP | 2008-141094 A | 6/2008 |
| JP | 2008-205326 A | 9/2008 |
| JP | 2012-121968 A | 6/2012 |
| JP | 2012-124304 A | 6/2012 |
| JP | 2012-221633 A | 11/2012 |
| JP | 2014-067782 A | 4/2014 |
| JP | 2015-228401 A | 12/2015 |
| JP | 2016-72408 A | 5/2016 |
| WO | 03/081734 A1 | 10/2003 |
| WO | 2017/026093 A1 | 2/2017 |
| WO | 2017/138666 A1 | 8/2017 |
| WO | 2017/163593 A1 | 9/2017 |

OTHER PUBLICATIONS

Toa Zhou et al. "Au/Sn Solder Alloy and Its Applications in Electronics Packaging ", 2010 pp. 1-7 (Year: 2010).*
International Search Report and Written Opinion issued on Oct. 29, 2019 in International Application No. PCT/JP2019/030656; with partial English translation.
Extended European Search Report dated on Sep. 1, 2021, issued in the corresponding European Patent Application No. 19846304.4.

* cited by examiner

BEFORE TEMPERATURE CYCLE TEST (INITIAL STAGE)

[AFTER TEMPERATURE CYCLE TEST (500 TIMES)]

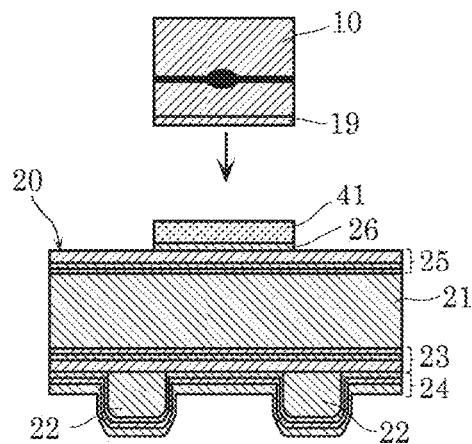
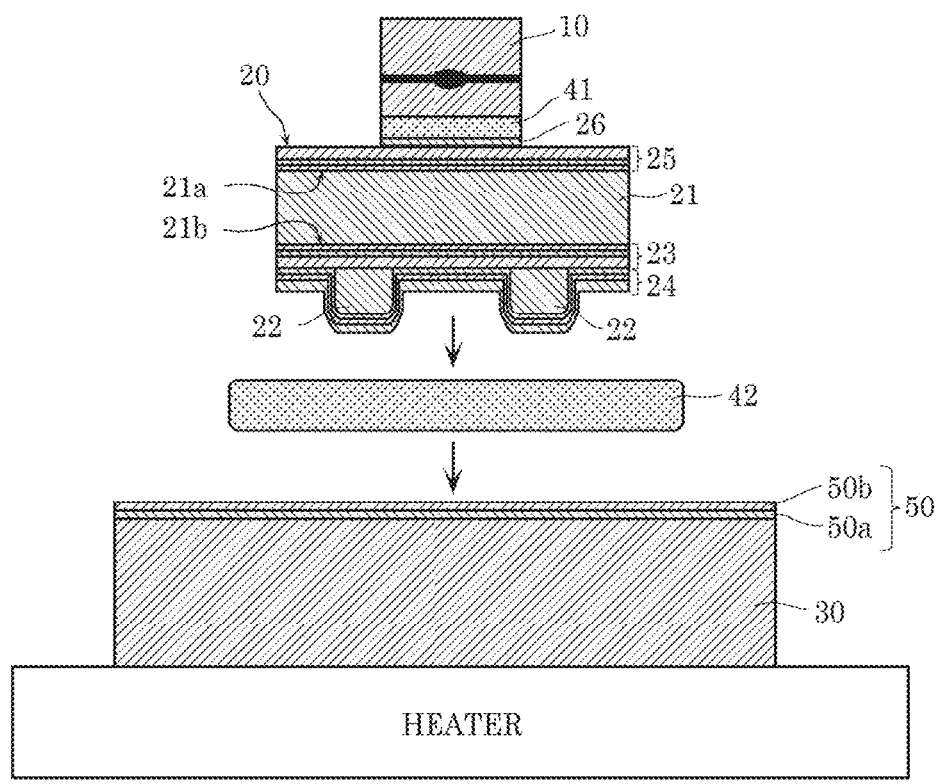

[KEEP HEATING AND PRESS]

SEMICONDUCTOR LIGHT-EMITTING APPARATUS AND METHOD OF FABRICATING SEMICONDUCTOR LIGHT-EMITTING APPARATUS

TECHNICAL FIELD

The present disclosure relates to a semiconductor light-emitting apparatus and a method of fabricating the semiconductor light-emitting apparatus.

BACKGROUND ART

Semiconductor light-emitting devices, such as a semiconductor laser (LD) and a light-emitting diode (LED), are used in many optical systems because of benefits like reasonable prices and the easiness of use. For instance, a semiconductor laser having relatively low optical output power is used as, for example, a light source for reading and writing a signal in optical disk equipment or a light source for optical communication in an optical communication system. With the improved laser beam output power in recent years, semiconductor lasers are now more widely used and are used, for example, as an illumination light source and the light source of laser machining equipment.

Among semiconductor lasers, GaN semiconductor lasers capable of emitting a laser beam in the ultraviolet to green wavelength range are under development. GaN semiconductor lasers can be used, for example, as illumination light sources. In this case, through the combination of a semiconductor laser that emits a blue laser beam and a fluorescent substance that absorbs blue light and emits yellow fluorescent light, it is possible to make a white light source that emits white light. Compared with the light of a light-emitting diode, light emitted by a semiconductor laser enables creation of a smaller spot of concentrated light on a fluorescent substance. Thus, by including a semiconductor laser, it is possible to make a highly directional illumination light source. Hence, an illumination light source including a semiconductor laser is suitable for the light source of a spotlight that provides long-range illumination or the light source of the high beam of a vehicle headlamp.

However, environments in which vehicle headlamps are used are extremely severe for semiconductor lasers. Thus, a semiconductor laser used as the light source of a vehicle headlamp should operate in a broad temperature range from a low temperature, such as a temperature in a cold climate area, to a high temperature, such as a temperature near an engine compartment in midsummer.

In addition, preferably, light emitted from an illumination light source should be bright, and thus an illumination light source should have higher laser beam output power. Meanwhile, a high-optical-output-power semiconductor laser generates a large amount of heat when emitting a laser beam. Thus, to efficiently transfer heat generated in the semiconductor laser to the outside, a packaging structure including the semiconductor laser should have high heat dissipation performance.

Accordingly, in a semiconductor laser used as the light source of a vehicle headlamp, it is important to make a packaging structure that has high heat dissipation performance and high robustness to a temperature cycle in a broad temperature range.

Patent Literature 1 (PTL 1) discloses a packaging structure of this type. FIG. 30 illustrates a packaging structure of the optical semiconductor device disclosed in PTL 1. As illustrated in FIG. 30, optical semiconductor device chip 1010 disclosed in PTL 1 is connected to submount 1020 with AuSn solder 1041 interposed therebetween. Submount 1020 is connected to metal heat dissipation block 1030 with AuSn solder 1042 interposed therebetween.

Striped groove 1028 is formed on the surface of submount 1020 connected to heat dissipation block 1030. Without filling groove 1028, submount 1020 and heat dissipation block 1030 are bonded to each other with AuSn solder 1042. Thus, cavities 1029 are formed in groove 1028, which enables elastic deformation of AuSn solder 1042 and submount 1020 around cavities 29. Accordingly, it is possible to reduce thermal strain to be caused between submount 1020 and heat dissipation block 1030.

FIG. 31 illustrates a packaging structure of the light-emitting diode module disclosed in Patent Literature 2 (PTL 2). As illustrated in FIG. 31, in the packaging structure disclosed in PTL 2, LED chips 2010 are connected to wiring substrate 2020. Wiring substrate 2020 is connected to heat dissipation substrate 2030 with bonding material 2042 interposed therebetween. In addition to bonding material 2042, supporter 2050 is disposed between wiring substrate 2020 and heat dissipation substrate 2030. Supporter 2050 is made of, for example, a resin material or a metal bump.

FIG. 32 illustrates a packaging structure of the light-emitting apparatus disclosed in Patent Literature 3 (PTL 3). As illustrated in FIG. 32, in the packaging structure disclosed in PTL 3, light-emitting devices 3010 are mounted on ceramic substrate 3020, and ceramic substrate 3020 is connected to mounting substrate 3030 with metal bumps 3040 interposed therebetween. The spaces between metal bumps 3040 are filled with resin.

CITATION LIST

Patent Literature

PTL 1: Japanese Unexamined Patent Application Publication No. 11-214791
PTL 2: WO2017/163593
PTL 3: Japanese Unexamined Patent Application Publication No. 2016-72408

SUMMARY OF THE INVENTION

Technical Problems

However, in the configurations disclosed in PTL 1 to 3, it is difficult to make a packaging structure that has high heat dissipation performance and high robustness to a temperature cycle.

For instance, in the packaging structure disclosed in PTL 1 and illustrated in FIG. 30 and the packaging structure disclosed in PTL 3 and illustrated in FIG. 32, heat dissipation performance is low due to high thermal resistance, which is considered a problem. Specifically, since the packaging structure illustrated in FIG. 30 has cavities 1029, an area available for heat dissipation (heat dissipation area) is small.

In this respect, in the packaging structure illustrated in FIG. 32, the spaces between metal bumps 3040 are filled with the resin, that is, a larger heat dissipation area is obtained, compared with the packaging structure illustrated in FIG. 30. However, a resin material has significantly lower thermal conductivity than metals and thus has high thermal resistance, which is considered a problem.

Meanwhile, in the packaging structure disclosed in PTL 2 and illustrated in FIG. 31, wiring substrate 2020 and heat dissipation substrate 2030 are connected to each other with bonding material 2042 without a gap. Thus, a heat dissipation area is obtained. However, a resin or a metal bump used as supporter 2050 typically has a thickness of a few tens of μm and thus naturally has a thickness similar to that of bonding material 2042. In addition, just thickening of bonding material 2042 results in increased thermal resistance. The resin and the metal bump are intended to be deformed by pressure for bonding, and thus it is also difficult to accurately control the thickness of supporter 2050.

The present disclosure has been made to address the foregoing problems and aims to provide: a semiconductor light-emitting apparatus that has sufficient strength against thermal strain caused by a temperature cycle and in which an increase in thermal resistance is suppressed; and a method of fabricating the semiconductor light-emitting apparatus.

Solutions to Problems

To achieve the above object, an embodiment of a first semiconductor light-emitting apparatus according to the present disclosure, includes a substrate, a submount above the substrate, and a semiconductor light-emitting device above the submount. The semiconductor light-emitting device and the submount are bonded to each other with a first bonding material. The substrate and the submount are bonded to each other with a second bonding material. The submount has a first region and a second region near the substrate, the first region being a region on which a spacer is disposed, and the second region being a region without the spacer. The submount is bonded to the substrate by covering at least a portion of the second region with the second bonding material.

An embodiment of a second semiconductor light-emitting apparatus according to the present disclosure, includes: a substrate; a submount disposed above the substrate and including a submount main body; and a semiconductor light-emitting device above the submount. The semiconductor light-emitting device and the submount are bonded to each other with a first bonding material. The substrate and the submount are bonded to each other with a second bonding material. The semiconductor light-emitting device is a semiconductor laser that operates in a state in which a difference between power consumption and optical output power is greater than or equal to 3 W. A decrease of optical output power for an operating current If after a temperature cycle test is at most 20% of optical output power for the operating current If before the temperature cycle test, the temperature cycle test being a test in which a temperature cycle from 125 degrees Celsius to negative 40 degrees Celsius is repeated 1,000 times. The main surface of the submount main body near the substrate has an area greater than or equal to 0.6 mm². The first bonding material has a thickness less than 3 μm. The following Expressions 1 and 2 are satisfied, where d (m) is the average thickness of the second bonding material, ΔT (K) is a temperature change range ensured in the semiconductor light-emitting apparatus, $\alpha_{sub}$ (K$^{-1}$) is the thermal expansion coefficient of the submount main body, $\alpha_{stem}$ (K$^{-1}$) is the thermal expansion coefficient of the substrate, Z (GPa) is the modulus of elasticity of the second bonding material, W (m) is the width of the submount main body, L (m) is the length of the submount main body, and C (GN/m) is the crack-occurrence critical constant of the second bonding material.

[Math. 1]

$$\Delta T \cdot (a_{stem} - a_{sub}) \cdot Z \cdot \left( \frac{\frac{W}{2} \cdot \frac{L}{2}}{d} \right) \le C \quad \text{(Expression 1)}$$

[Math. 2]

$$C = 3 \times 10^{-3} \quad \text{(Expression 2)}$$

An embodiment of a third semiconductor light-emitting apparatus according to the present disclosure, includes: a substrate; a submount above the substrate; and a semiconductor light-emitting device above the submount. The semiconductor light-emitting device and the submount are bonded to each other with a first bonding material. The substrate and the submount are bonded to each other with a second bonding material. A gold layer or a layer including gold is formed on the outermost surface of the substrate as a layer having a thickness greater than or equal to 1 μm. The semiconductor light-emitting device is a semiconductor laser that operates in a state in which a difference between power consumption and optical output power is greater than or equal to 3 W. The following Expressions 1 and 2 are satisfied, where d (m) is the average thickness of the second bonding material, ΔT (K) is a temperature change range ensured in the semiconductor light-emitting apparatus, $\alpha_{sub}$ (K$^{-1}$) is the thermal expansion coefficient of the base material of the submount, $\alpha_{stem}$ (K$^{-1}$) is the thermal expansion coefficient of the substrate, Z (GPa) is the modulus of elasticity of the second bonding material, W (m) is the width of the submount, L (m) is the length of the submount, and C (GN/m) is the crack-occurrence critical constant of the second bonding material.

[Math. 3]

$$\Delta T \cdot (a_{stem} - a_{sub}) \cdot Z \cdot \left( \frac{\frac{W}{2} \cdot \frac{L}{2}}{d} \right) \le C \quad \text{(Expression 1)}$$

[Math. 4]

$$C = 3 \times 10^{-3} \quad \text{(Expression 2)}$$

An embodiment of a fourth semiconductor light-emitting apparatus according to the present disclosure, includes: a submount having a first main surface and a second main surface opposite to the first main surface; and a semiconductor light-emitting device disposed near the first main surface of the submount. The submount and the semiconductor light-emitting device are bonded to each other with a first bonding material. The second main surface of the submount has a first region on which a spacer is disposed and a second region without the spacer.

An embodiment of a method of fabricating a semiconductor light-emitting apparatus according to the present disclosure is a method of fabricating a semiconductor light-emitting apparatus that includes a substrate and a submount including a submount main body. The submount main body has a first main surface near which a semiconductor light-emitting device is mounted and a second main surface opposite to the first main surface. The second main surface of the submount main body has a first region on which a spacer is disposed and a second region without the spacer. The method includes: disposing the submount above the substrate with a melted bonding material interposed between the submount and the substrate in a state in which the second main surface is oriented toward the substrate; and cooling the melted bonding material to fix the submount to the substrate.

Advantageous Effect of Invention

Thus, it is possible to obtain a semiconductor light-emitting apparatus that has sufficient strength against thermal strain caused by a temperature cycle and in which an increase in thermal resistance is suppressed.

BRIEF DESCRIPTION OF DRAWINGS

FIG. 15A illustrates mounting of the semiconductor laser above the submount in the method of fabricating the semiconductor light-emitting apparatus according to Embodiment 1.

FIG. 15B illustrates mounting of the submount, above which the semiconductor laser is mounted, above the substrate in the method of fabricating the semiconductor light-emitting apparatus according to Embodiment 1.

DESCRIPTION OF EXEMPLARY EMBODIMENTS (Underlying Knowledge Forming the Basis of the Present Disclosure)

Before explaining the embodiments of the present disclosure, a background leading up to an aspect of the present disclosure is discussed below.

Figure 1:
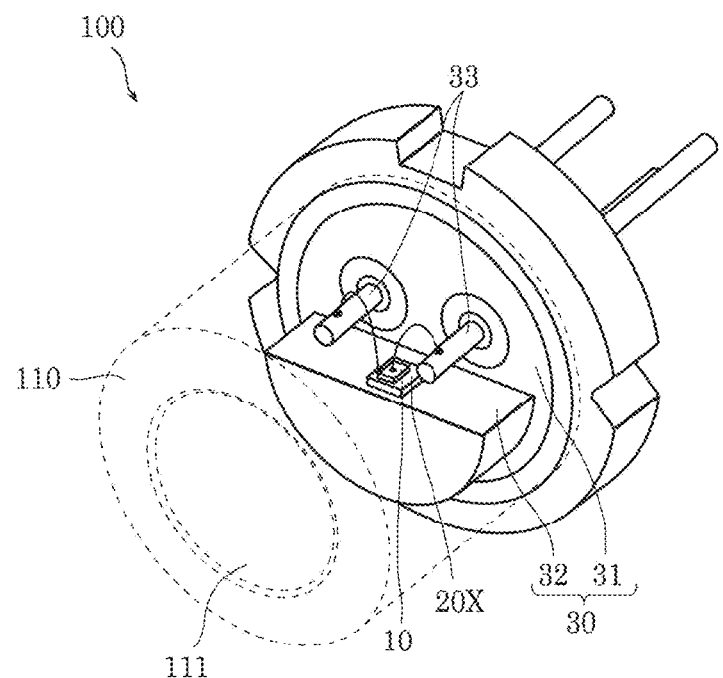
FIG. 1 illustrates a configuration of a semiconductor light-emitting apparatus having a TO-CAN package structure.
Figure 2:
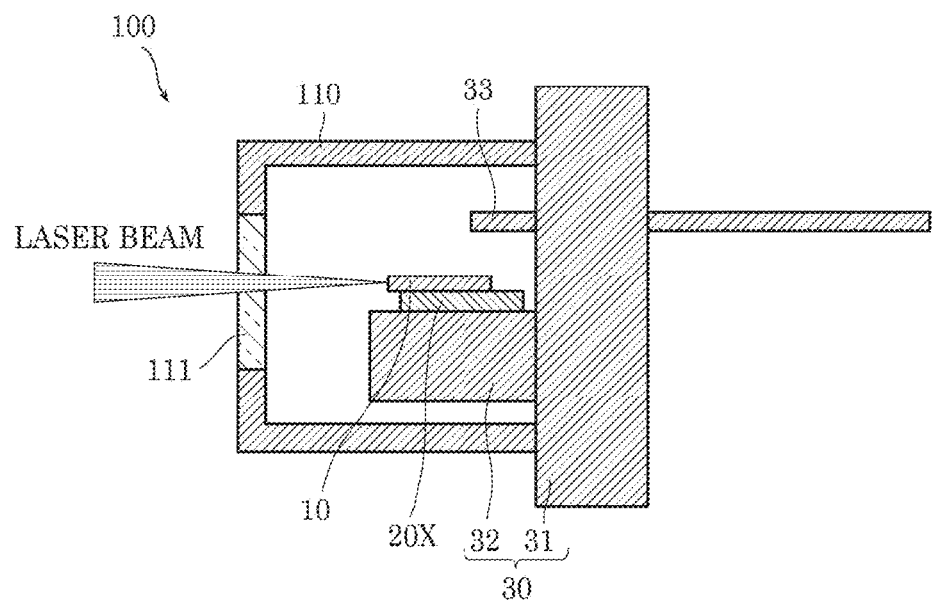
FIG. 2 is a cross-sectional view of the semiconductor light-emitting apparatus having the TO-CAN package structure.

Conventionally, a semiconductor light-emitting device, such as a semiconductor laser or a light-emitting diode, is packaged in a packaging structure in which heat dissipation performance is taken into account. For instance, as illustrated in FIGS. 1 and 2, a semiconductor laser is packaged in a TO-CAN package. FIG. 1 illustrates a configuration of semiconductor light-emitting apparatus 100 having a TO-CAN package structure. FIG. 2 is a cross-view of semiconductor light-emitting apparatus 100. It should be noted that the dashed-lines illustrated in FIG. 1 denote cap 110.

As illustrated in FIGS. 1 and 2, in semiconductor light-emitting apparatus 100, semiconductor laser 10 is connected and fixed to submount 20X with a bonding material, such as AuSn solder. Semiconductor laser 10 is, for example, a GaN semiconductor laser made of a nitride semiconductor material. For instance, diamond is used as the base material of submount 20X.

Submount 20X on which semiconductor laser 10 is mounted is connected and fixed to metal substrate (stem) 30 with a bonding material, such as AuSn solder. Substrate 30 is a stem with electrode terminals.

Specifically, substrate 30 has stem base 31 and semicylindrical stem post 32 attached to stem base 31. Submount 20X is fixed to stem post 32. For instance, Cu is used as the material of each of stem base 31 and stem post 32.

Stem base 31 has a pair of lead pins 33 as electrode terminals for externally supplying power to semiconductor laser 10. The pair of lead pins 33 are electrically connected to a pair of electrodes of semiconductor laser 10. Specifically, one of the pair of lead pins 33 is connected to one of the pair of electrodes of semiconductor laser 10 with gold wire. In addition, the other of the pair of lead pins 33 is connected to the submount with gold wire, the submount being connected to the other of the pair of electrodes of semiconductor laser 10 with a bonding material interposed therebetween.

In addition, metal cap 110 (can) is attached to stem base 31. Cap 110 accommodates semiconductor laser 10 and submount 20X. Flat glass 111 is attached to cap 110 to enable light from semiconductor laser 10 to transmit through flat glass 111.

Semiconductor light-emitting apparatus 100 having the above configuration is used as the illumination light source of, for example, a vehicle headlamp. As discussed above, a semiconductor laser for use in the light source of a vehicle headlamp should operate in a broad temperature range, from a high temperature to a low temperature.

For instance, according to the reliability test standard AEC-Q102 applied to semiconductor light-emitting devices as vehicle components, a characteristic change should be at most 20% even when a temperature rise-and-fall cycle (temperature cycle), from negative 40 degrees Celsius to positive 125 degrees Celsius, is repeated 1,000 times. This temperature range is broader than that to which information-processing equipment intended for use indoors is subjected.

Figure 3:
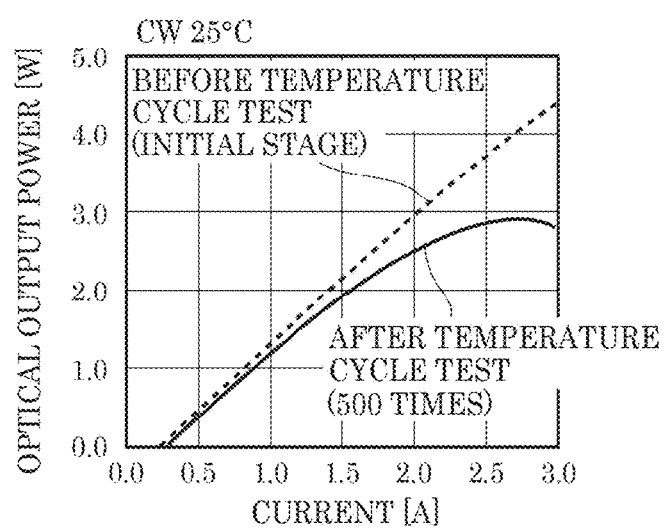
FIG. 3 illustrates characteristics regarding the relationship between current and optical output power in the semiconductor light-emitting apparatus before and after a temperature cycle test conducted in conformity with the reliability test standard AEC-Q102.

In conformity with the reliability test standard AEC-Q102 for vehicle components, a temperature cycle test was conducted for the semiconductor light-emitting apparatus having the packaging structure illustrated in FIGS. 1 and 2. As illustrated in FIG. 3, the result shows that the optical output power of the semiconductor light-emitting apparatus after the temperature cycle test is lower than that of the semiconductor light-emitting apparatus before the temperature cycle test. The decreased optical output power is considered due to the increased temperature of the semiconductor laser.

Figure 4:
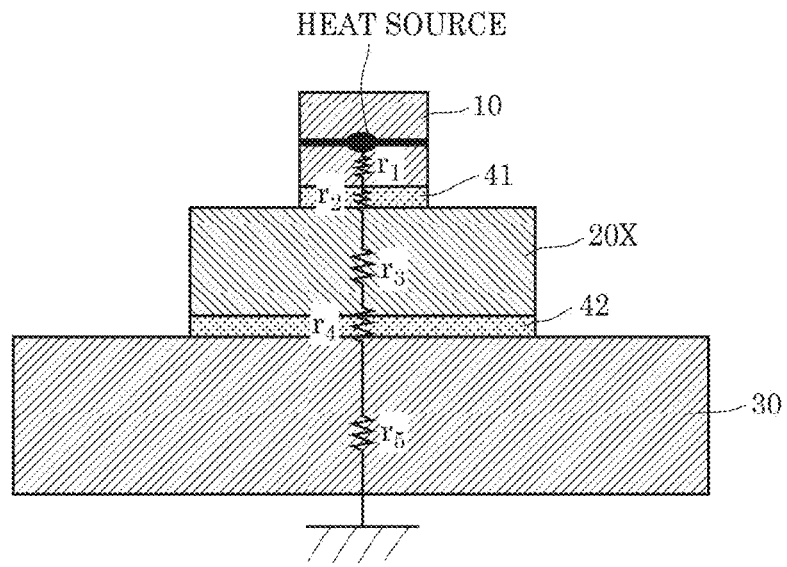
FIG. 4 illustrates a configuration of the semiconductor light-emitting apparatus that has undergone the temperature cycle test in conformity with the reliability test standard AEC-Q102.

To investigate the cause, the inventors of the present application analyzed the semiconductor light-emitting apparatus before and after the temperature cycle test. FIG. 4 illustrates a configuration of the semiconductor light-emitting apparatus that has undergone the temperature cycle test.

As illustrated in FIG. 4, in the semiconductor light-emitting apparatus that has undergone the temperature cycle test, semiconductor laser 10 and submount 20X are bonded to each other with first bonding material 41 made of AuSn solder. In addition, submount 20X and substrate 30 (stem post 32) are bonded to each other with second bonding material 42 made of AuSn solder.

Then, in the semiconductor light-emitting apparatus, thermal resistance in a heat dissipation path from the heat source (laser generation unit) of semiconductor laser 10 to substrate 30 was measured before and after the temperature cycle test. It should be noted that in FIG. 4, thermal resistance r1 denotes thermal resistance in semiconductor laser 10, thermal resistance r2 denotes thermal resistance in first bonding material 41, thermal resistance r3 denotes thermal resistance in submount 20X, thermal resistance r4 denotes thermal resistance in second bonding material 42, and thermal resistance r5 denotes thermal resistance in substrate 30.

Figure 5:
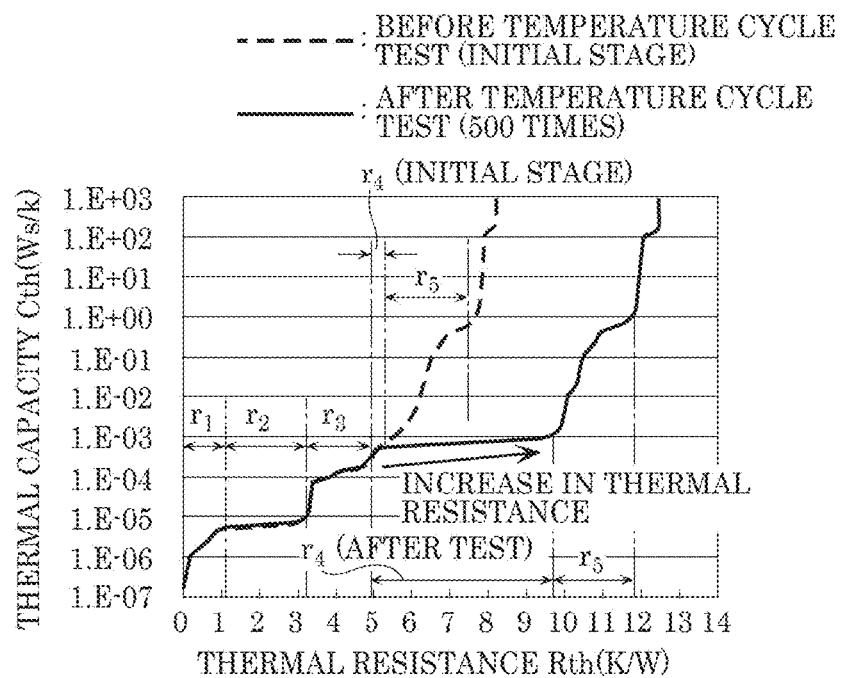
FIG. 5 illustrates a relationship between the thermal resistance and the thermal capacity of the semiconductor light-emitting apparatus before and after the temperature cycle test conducted in conformity with the reliability test standard AEC-Q102.

FIG. 5 illustrates the results of the measurement of the thermal resistance. As illustrated in FIG. 5, thermal resistance r4 in second bonding material 42 between submount 20X and substrate 30 significantly increased, compared with the thermal resistance in each of the other components.

Figure 6A:
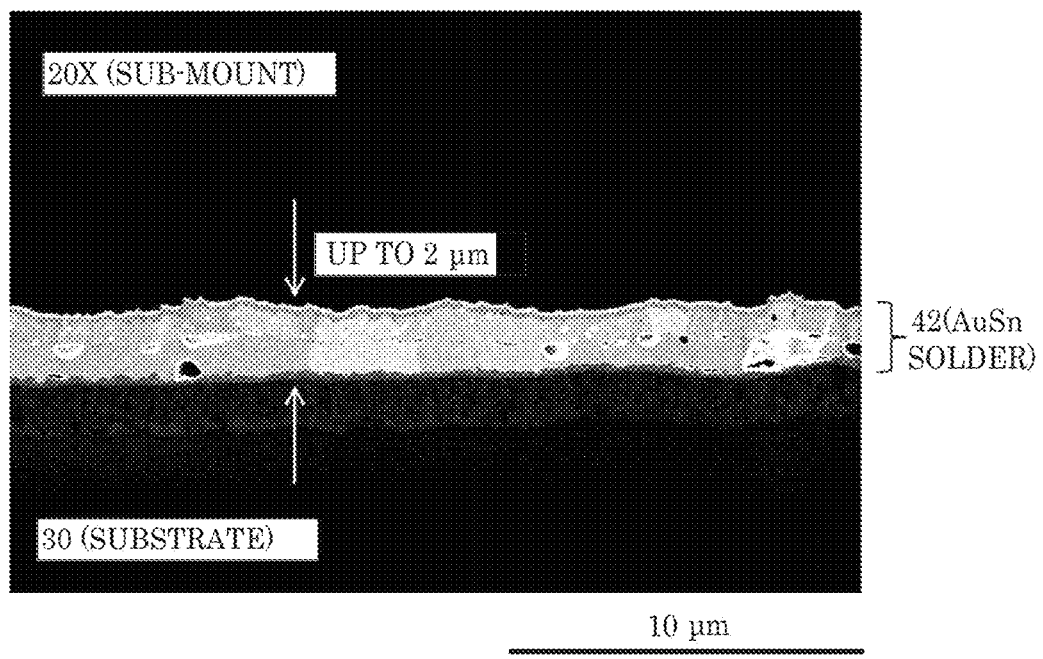
FIG. 6A is an SEM cross-section image of a second bonding material and its surrounding portions in the semiconductor light-emitting apparatus before the temperature cycle test conducted in conformity with the reliability test standard AEC-Q102.
Figure 6B:
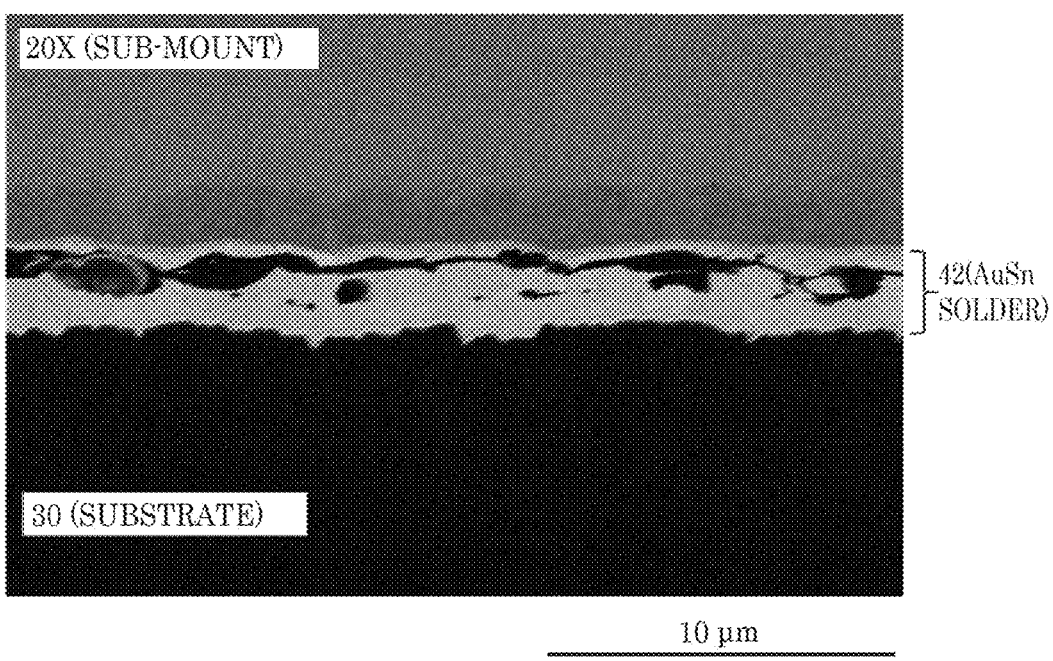
FIG. 6B is an SEM cross-section image of the second bonding material and its surrounding portions in the semiconductor light-emitting apparatus after the temperature cycle test conducted in conformity with the reliability test standard AEC-Q102.

Thus, second bonding material 42 (AuSn solder) between submount 20X and substrate 30 and its surrounding portions were investigated. As illustrated in the SEM cross-section images of FIGS. 6A and 6B, the quality of second bonding material 42 degraded after the temperature cycle test. FIG. 6A is an SEM cross-section image of second bonding material 42 and its surrounding portions before (in the initial stage of) the temperature cycle test. FIG. 6B is an SEM cross-section image of second bonding material 42 and its surrounding portions after the temperature cycle test (500 times).

As is clear from comparison between FIGS. 6A and 6B, after the temperature cycle test, the layer of second bonding material 42 has cracks (voids).

The inventors of the present application investigated the cause of the occurrence of the cracks in second bonding material 42 between submount 20X and substrate 30. Then, the inventors came to the conclusion that the occurrence of the cracks in second bonding material 42 was due to a difference in the thermal expansion coefficient between submount 20X and substrate 30. Details in this respect are discussed below.

As the typical base material of the submount (submount main body), a material that has high thermal conductivity and electric resistance and whose thermal expansion coefficient is relatively close to that of a semiconductor laser is used. For instance, for a GaN semiconductor laser, diamond, AlN or SiC is used as the typical base material of the submount.

Meanwhile, a relatively low-priced metal material that can be easily profiled is used as the material of the substrate (stem) to which the submount is bonded. As the material of the substrate of a TO-CAN package, for example, copper (Cu), iron (Fe), or aluminum (Al) is used.

However, as illustrated in table 1 below, the material of the substrate (e.g., Cu, Fe, Al) has a significantly higher thermal expansion coefficient than the base material of the submount (e.g., diamond, AlN, SiC). To decrease thermal resistance in the semiconductor light-emitting apparatus, there is no other choice but to choose a combination of a submount and a substrate that have a large difference in the thermal expansion coefficient.

TABLE 1

| Material | Thermal conductivity [W/mK] | Thermal expansion coefficient [× $10^{-6}$ $K^{-1}$] | |
|---|---|---|---|
| GaN (semiconductor laser) | 130 | 5.6 | |
| Cu | 390 | 17 | Substrate (stem) |
| Fe | 67 | 11.7 | |
| Al | 237 | 23.7 | |
| AuSn solder (Sn: 20wt %) | 57.3 | 17.5 | |
| AlN ceramic | 60 to 230 | 4.4 to 4.6 | Submount main body |
| SiC ceramic | 60 to 210 | 3.7 to 4.1 | |
| High-thermal conductivity SiC ceramic | 320 | 3.7 | |
| SiC single crystal | 490 | 4.2 | |
| CVD diamond | 1000 to 2000 | 2.2 | |
| DC60 (mixed material of diamond and Cu) | 600 | 6 | |
| Alloy of Cu and Mo | 160 to 290 | 7 to 13 | |
| Alloy of Cu and W | 180 to 230 | 6.5 to 8.3 | |
| Ag | 429 | 18.9 | |
| Au | 295 | 14.2 | |
| Mo | 159 | 5.1 | |
| W | 167 | 4.5 | |

Thus, when there is a large difference in the thermal expansion coefficient between the submount and the substrate, connection interfaces having a large difference in the thermal expansion coefficient are formed between the submount and the stem. In the interfaces, a change in the temperature causes thermal strain, which concentrates on the bonding material (AuSn solder) between the submount and the substrate. Specifically, thermal strain concentrates on the interface between the submount and the bonding material and the interface between the substrate and the bonding material.

In this case, while being able to absorb low thermal strain, the bonding material cannot absorb high thermal strain. In particular, when a temperature cycle having a large difference between a high temperature and a low temperature is repeated, a difference in the amount of thermal expansion (when temperature increases) between the submount and the substrate increases, and a difference in the amount of thermal contraction (when temperature decreases) between the submount and the substrate increases. Thus, the bonding material between the submount and the substrate is no longer able to absorb thermal strain.

When the bonding material is no longer able to absorb thermal strain, a crack occurs in the bonding material and partially interrupts the heat dissipation path between the submount and the substrate, which results in increased thermal resistance. Thus, heat dissipation performance decreases, and the temperature of the semiconductor laser increases. Consequently, the optical output power of the semiconductor laser decreases.

To suppress the increase in the thermal resistance in the bonding material due to the occurrence of the crack, thickening of the bonding material may be considered. However, since being a compound metal material made of multiple metals, the bonding material, such as solder, typically has low thermal conductivity. Thus, when the bonding material becomes too thick, thermal resistance increases.

The inventors of the present application conducted the temperature cycle test (1,000 times), using, as parameters, the base material and the size of the submount, the thickness of the bonding material (AuSn solder), and a temperature change range. Then, the inventors empirically formulated (modeled) a critical point at which a crack experimentally occurs in the bonding material.

Figure 7:
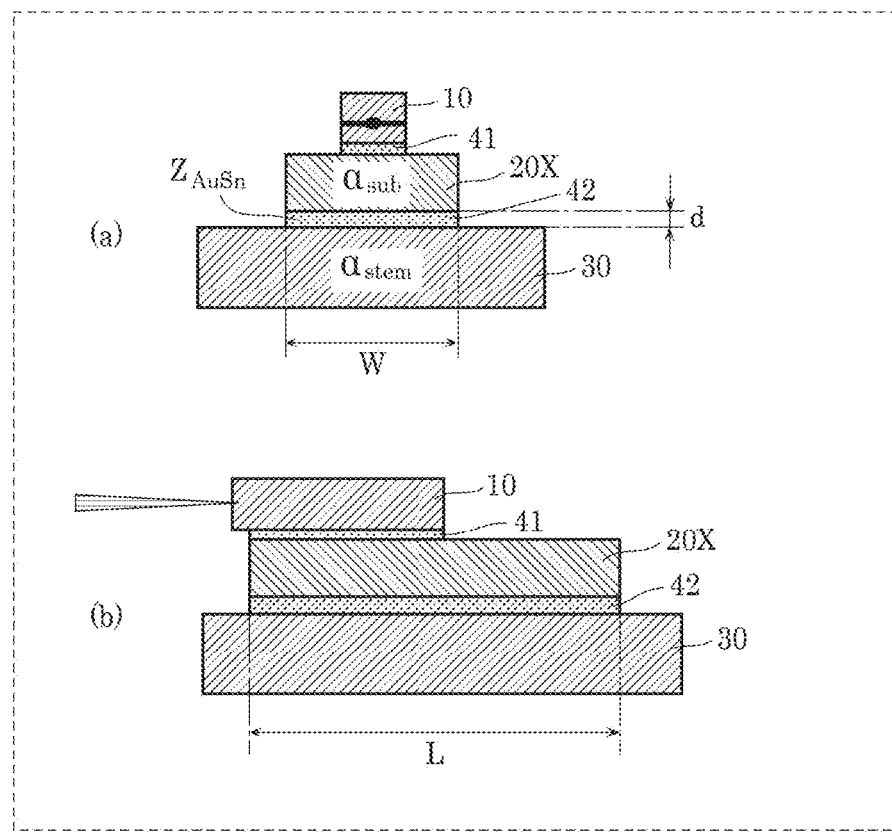
FIG. 7 illustrates a configuration of the semiconductor light-emitting apparatus that has undergone the temperature cycle test in conformity with the reliability test standard AEC-Q102. (a) in FIG. 7 is a cross-sectional view of the semiconductor light-emitting apparatus viewed from in front of the semiconductor light-emitting apparatus. (b) in FIG. 7 is a cross-sectional view of the semiconductor light-emitting apparatus viewed from the side.

Specifically, in the semiconductor light-emitting apparatus illustrated in FIG. 7, the following Expression 1 is satisfied, where d (m) is the thickness of second bonding material 42, $\Delta T$ (K) is a temperature change range ensured in the semiconductor light-emitting apparatus, $\alpha_{sub}$ ($K^{-1}$) is the thermal expansion coefficient of the base material of submount 20X, $\alpha_{stem}$ ($K^{-1}$) is the thermal expansion coefficient of substrate 30, Z (GPa) is the modulus of elasticity of second bonding material 42, W (m) is the width of submount 20X, L (m) is the length of submount 20X, and C (GN/m) is the crack-occurrence critical constant of second bonding material 42, as a critical point as to whether the quality of second bonding material 42 is degraded.

[Math. 5]

$$\Delta T \cdot (\alpha_{stem} - \alpha_{sub}) \cdot Z \cdot \left( \frac{\frac{W}{2} \cdot \frac{L}{2}}{d} \right) \leq C \quad \text{(Expression 1)}$$

Then, as illustrated in the following table 2, the inventors of the present application changed the parameters, which are the base material (thermal expansion coefficient) and the size of submount 20X, the thickness of second bonding material 42 (AuSn solder), and the temperature change range in the temperature cycle test, and then empirically obtained the crack-occurrence critical constant C.

TABLE 2

| Submount | | | AuSn solder | Temperature cycle test | | Stem (substrate) | | Submount | | Modulus of elasticity of AuSn solder $Z_{AuSn}$ (GPA) | Value of left side C ($\times 10^{-3}$ GN/m) | Results of temperature cycle experiment |
|---|---|---|---|---|---|---|---|---|---|---|---|---|
| Length (L) ($\times 10^{-3}$ m) | (Width (W) ($\times 10^{-3}$ m) | Thickness (d) ($\times 10^{-6}$ m) | | Highest temperature (° C.) | Lowest temperature (° C.) | Material | Thermal expansion on coefficient $\alpha_{stem}$ ($\times 10^{-6} K^{-1}$) | Material | Thermal expansion on coefficient $\alpha_{sub}$ ($\times 10^{-6} K^{-1}$) | | | |
| 1.26 | 0.61 | 2 | | 125 | −40 | Cu | 16.8 | diamond | 2.2 | 22.7 | 5.25 | x |
| 1.26 | 0.61 | 3 | | 125 | −40 | Cu | 16.8 | diamond | 2.2 | 22.7 | 3.50 | x |
| 1.26 | 0.61 | 10 | | 125 | −40 | Cu | 16.8 | diamond | 2.2 | 22.7 | 1.05 | o |
| 1.26 | 0.61 | 40 | | 125 | −40 | Cu | 16.8 | diamond | 2.2 | 22.7 | 0.26 | o |
| 1.26 | 0.61 | 2 | | 85 | −40 | Cu | 16.8 | diamond | 2.2 | 22.7 | 3.98 | x |
| 1.50 | 0.70 | 3 | | 85 | −40 | Cu | 16.8 | AlN | 5.7 | 22.7 | 2.76 | o |
| 1.33 | 0.60 | 2 | | 125 | −40 | Cu | 16.8 | SiC | 4.0 | 22.7 | 4.78 | x |
| 0.933 | 0.60 | 2 | | 125 | −40 | Cu | 16.8 | SiC | 4.0 | 22.7 | 3.35 | x |
| 0.933 | 0.60 | 2 | | 85 | −40 | Cu | 16.8 | SiC | 4.0 | 22.7 | 2.54 | o | o absence of degradation
x presence of degradation

Figure 8:
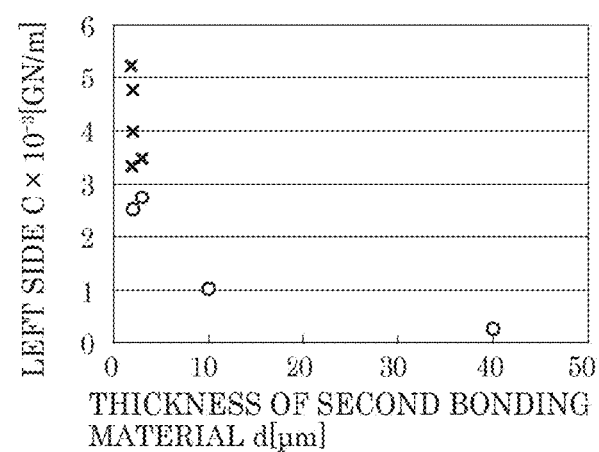
FIG. 8 illustrates a relationship between left side C of Expression 1 and the thickness of the second bonding material in the semiconductor light-emitting apparatus that has undergone the temperature cycle test in conformity with the reliability test standard AEC-Q102.

On the basis of the result of the experiment, FIG. 8 illustrates a relationship between the thickness of second bonding material 42 and the left side C×10⁻³ (GN/m). In FIG. 8, the plotted circles denote the absence of degradation in laser characteristics after conducting the temperature cycle test 1,000 times. The plotted crosses denote the presence of degradation in the laser characteristics after conducting the temperature cycle test 1,000 times.

As illustrated in FIG. 8, the result of the experiment shows that $C=3\times 10^{-3}$ (GN/m), where C is the crack-occurrence critical constant. Thickness d of second bonding material 42 should be preferably greater than or equal to at least 3.5 μm, more preferably, greater than or equal to 4.5 μm. It should be noted that the surface of each of submount 20X and substrate 30 may have very small projections and depressions of some positive and negative μm. Even in this case, the above Expression 1 is satisfied.

After careful study based on the foregoing result, the inventors of the present application finally came up with the idea that by appropriately controlling the thickness of the bonding material between the submount and the substrate (stem), it is possible to fabricate a semiconductor light-emitting apparatus that has sufficient strength against thermal strain caused by the temperature cycle and in which an increase in the thermal resistance is suppressed. The present disclosure is based on such an idea.

Hereinafter, the embodiments of the present disclosure based on the above idea are described. It should be noted that any of the embodiments described below is a mere specific example of the present disclosure. Thus, the numerical values, the shapes, the materials, the structural elements, the positions of the structural elements, the connections between the structural elements, the steps, the order of the steps, and other details given in the following embodiments are mere examples and are not intended to limit the present disclosure. Among the structural elements described in the following embodiments, the structural elements not included in the independent claims, which represent superordinate concepts of the present disclosure, are given as optional structural elements.

The Drawings are schematic views and not necessarily precisely drawn. Thus, for example, the scales used in the Drawings are not necessarily the same. In the Drawings, the same reference sign is assigned to substantially the same structural elements, and overlapping explanations are omitted or simplified.

Embodiment 1

Figure 9:
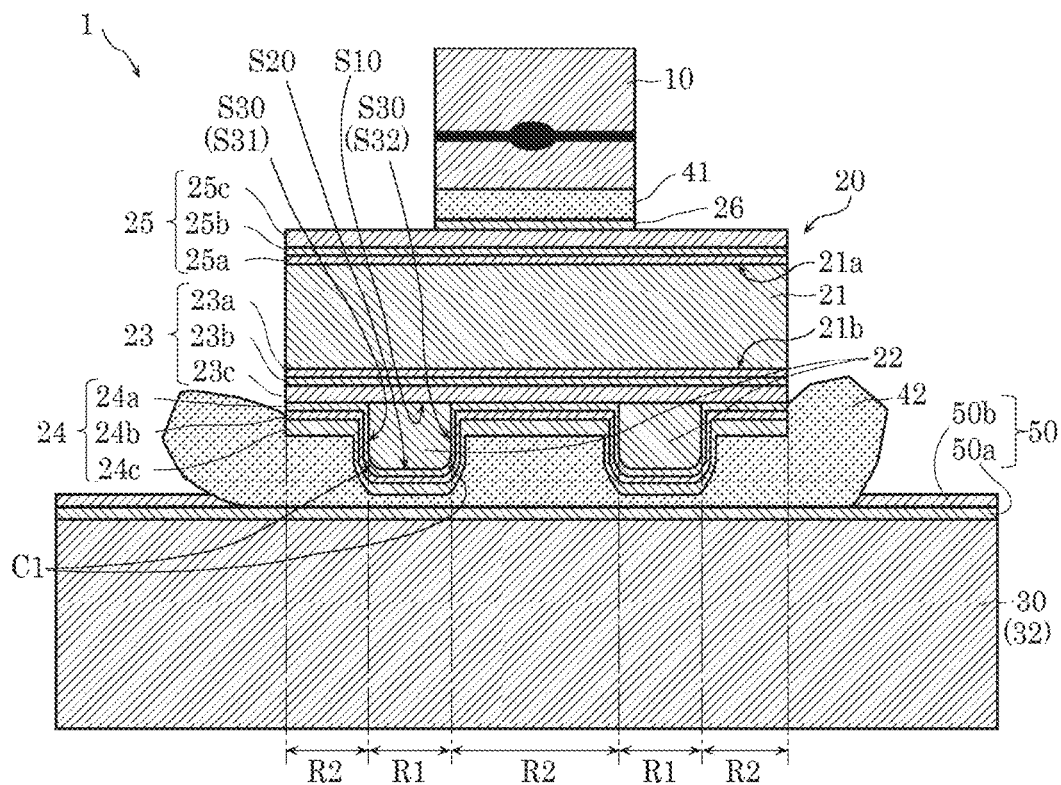
FIG. 9 is a cross-sectional view and illustrates a configuration of a semiconductor light-emitting apparatus according to Embodiment 1.
Figure 10:
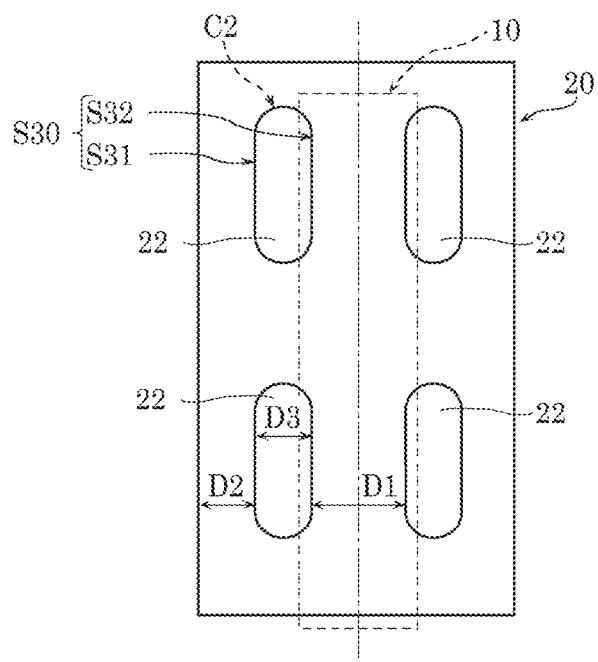
FIG. 10 is a bottom view of the submount of the semiconductor light-emitting apparatus according to Embodiment 1.

With reference to FIGS. 9 and 10, semiconductor light-emitting apparatus 1 according to Embodiment 1 is described. FIG. 9 is a cross-sectional view and illustrates a configuration of semiconductor light-emitting apparatus 1 according to Embodiment 1. FIG. 10 is a bottom view of submount 20 of semiconductor light-emitting apparatus 1.

Semiconductor light-emitting apparatus 1 according to Embodiment 1 of the present disclosure includes semiconductor laser 10 as an example of a semiconductor light-emitting device. As with the semiconductor light-emitting apparatus illustrated in FIGS. 1 and 2, semiconductor light-emitting apparatus 1 according to Embodiment 1 is a semiconductor laser apparatus having a TO-CAN package structure as a packaging structure.

As illustrated in FIG. 9, semiconductor light-emitting apparatus 1 includes semiconductor laser 10, submount 20, and substrate 30. Substrate 30 includes stem base 31 and stem post 32 (see FIGS. 1 and 2).

Semiconductor laser 10 is, for example, a GaN semiconductor laser (laser chip) made of a nitride semiconductor material. As an example, semiconductor laser 10 emits a blue laser beam having a peak wavelength in the 380 nm to 490 nm wavelength range. In Embodiment 1, semiconductor laser 10 operates in a state in which a difference between power consumption and optical output power in semiconductor laser 10 is greater than or equal to 3 W. It should be noted that in FIG. 9, the ellipse illustrated in semiconductor laser 10 schematically indicates the position of guided light inside the chip during laser oscillation. Semiconductor laser 10 is designed to concentrate injected currents on the ellipse. The ellipse illustrated in semiconductor laser 10 is common among other figures.

Submount 20 is a base for mounting semiconductor laser 10. Semiconductor laser 10 is above submount 20. Submount 20 is above substrate 30. Specifically, submount 20 is above stem post 32 of substrate 30. Thus, submount 20 is between semiconductor laser 10 and substrate 30 (stem post 32).

Semiconductor laser 10 and submount 20 are bonded to each other with first bonding material 41. Substrate 30 and submount 20 are bonded to each other with second bonding material 42. First bonding material 41 and second bonding material 42 are solder materials, such as AuSn solder. In Embodiment 1, first bonding material 41 is thinner than second bonding material 42. Preferably, the thickness of first bonding material 41 should be less than 3 μm. Meanwhile, the thickness of second bonding material 42 should be preferably greater than or equal to 3.5 μm, more preferably, greater than or equal to 4.5 μm.

Semiconductor laser 10 is mounted above submount 20 with first bonding material 41 interposed therebetween. In this case, semiconductor laser 10 may be mounted above submount 20 by junction-down mounting as illustrated in FIG. 11 or junction-up mounting as illustrated in FIG. 12.

Figure 11:
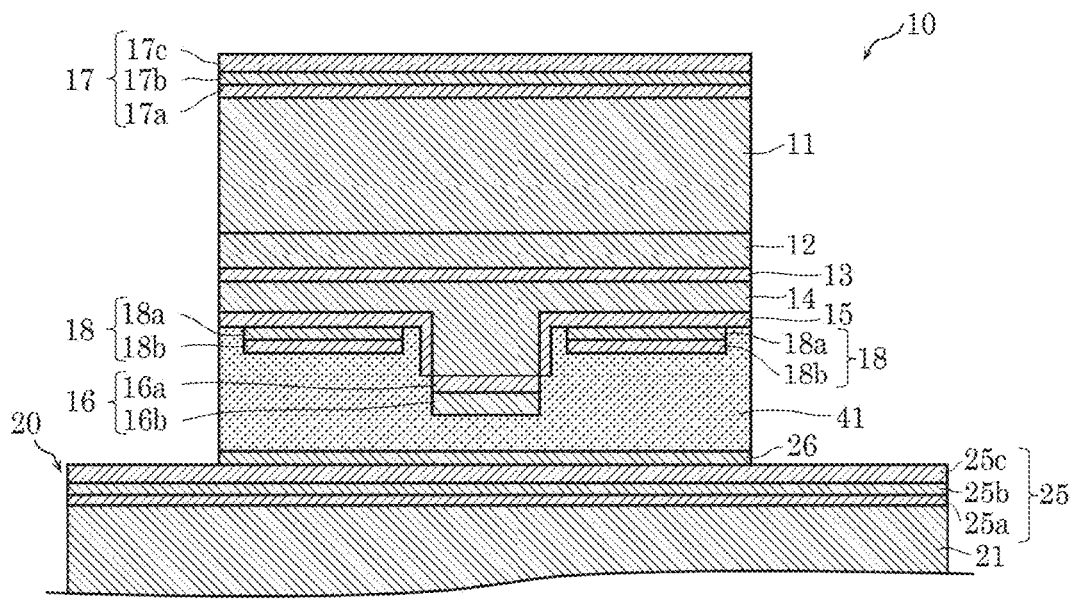
FIG. 11 illustrates a first example of mounting (junction-down mounting) of the semiconductor laser of the semiconductor light-emitting apparatus according to Embodiment 1.
Figure 12:
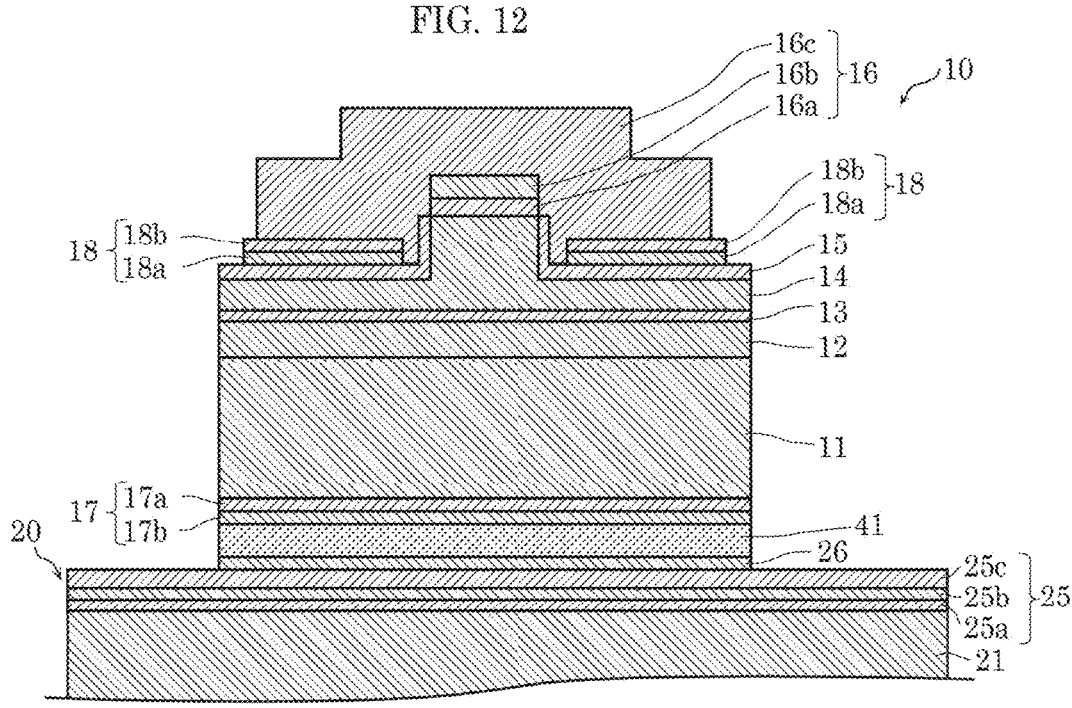
FIG. 12 illustrates a second example of mounting (junction-up mounting) of the semiconductor laser of the semiconductor light-emitting apparatus according to Embodiment 1.

As illustrated in FIGS. 11 and 12, as an example of the configuration of semiconductor laser 10, n-type semiconductor layer 12, active layer 13, and p-type semiconductor layer 14 that has a ridge are sequentially stacked on top of each other on the front side of semiconductor substrate 11, such as a GaN substrate. Insulating layer 15 (current blocking layer) made of $SiO_2$ is formed on the surface of p-type semiconductor layer 14. In addition, p-side electrode 16 is formed on the ridge of p-type semiconductor layer 14. N-side electrode 17 is formed on the back side of semiconductor substrate 11. Adhesion assisting layer 18 is formed on insulating layer 15. It should be noted that in FIG. 11, p-side electrode 16 has the two-layer structure of Pd layer 16a having a thickness of 40 nm and Pt layer 16b having a thickness of 100 nm. Meanwhile, in FIG. 12, p-side electrode 16 has the three-layer structure of Pd layer 16a having a thickness of 40 nm, Pt layer 16b having a thickness of 35 nm, and Au layer 16c having a thickness of 1.6 μm. In FIG. 11, n-side electrode 17 has the three-layer structure of Ti layer 17a having a thickness of 10 nm, Pt layer 17b having a thickness of 35 nm, and Au layer 17c having a thickness of 300 nm. Meanwhile, in FIG. 12, n-side electrode 17 has the two-layer structure of Ti layer 17a having a thickness of 10 nm and Pt layer 17b having a thickness of 35 nm. In FIG. 11, adhesion assisting layer 18 has the two-layer structure of Ti layer 18a having a thickness of 10 nm and Pt layer 18b having a thickness of 100 nm. Meanwhile, in FIG. 12, adhesion assisting layer 18 has the two-layer structure of Ti layer 18a having a thickness of 10 nm and Pt layer 18b having a thickness of 50 nm. It should be noted that adhesion assisting layer 18 is spaced apart from insulating layer 15 formed on the side of the ridge of p-type semiconductor layer 14.

Submount 20 has submount main body 21. The material of submount main body 21 forms the base material of submount 20. Preferably, the thermal conductivity of the base material (submount main body 21) of submount 20 should be greater than or equal to 130 $W \cdot m^{-1} \cdot K^{-1}$. The thermal expansion coefficient of the base material (submount main body 21) of submount 20 may be less than or equal to $5 \times 10^{-6}$ $K^{-1}$. A difference in the thermal expansion coefficient between the base material (submount main body 21) of submount 20 and substrate 30 to which submount 20 is connected may be greater than $11 \times 10^{-6}$ $K^{-1}$.

Submount main body 21 is made of a high-thermal-conductivity material, such as diamond, SiC, or AlN. In Embodiment 1, submount main body 21 is made of diamond. That is, the base material of submount 20 is diamond. In addition, submount main body 21 is substantially cuboid. Specifically, submount main body 21 has a rectangular plate-like shape.

Submount main body 21 has first main surface 21a and second main surface 21b. First main surface 21a is the surface near semiconductor laser 10 (surface on the side on which semiconductor laser 10 is mounted), and second main surface 21b is opposite to first main surface 21a. In Embodiment 1, second main surface 21b is the surface near substrate 30 (surface connected to substrate 30). The area of second main surface 21b (surface near substrate 30) of submount main body 21 may be greater than or equal to 0.6 $mm^2$.

Submount 20 has first region R1 and second region R2 near substrate 30, first region R1 being a region on which spacer 22 is disposed, and second region R2 being a region without spacer 22. Specifically, second main surface 21b of submount main body 21 has first region R1 and second region R2. That is, submount 20 has spacer 22 in first region R1 of second main surface 21b and does not have spacer 22 in second region R2 of second main surface 21b.

The main ingredient of spacer 22 is, for example, a metal selected from Cu, Al, Au, and Ag or an alloy including at least one of Cu, Al, Au, and Ag. In Embodiment 1, spacer 22 is made of Cu and formed by, for example, copper plating.

In first region R1, first metal film 23 is disposed between spacer 22 and second main surface 21b of submount main body 21. In Embodiment 1, in second region R2, first metal film 23 is also disposed between spacer 22 and second main surface 21b of submount main body 21. Specifically, first metal film 23 is formed on entire second main surface 21b of submount main body 21. It should be noted that in Embodiment 1, first metal film 23 is a part of submount 20.

First metal film 23 is used as a negative electrode when forming spacer 22 by plating. In this case, a resist is formed on the surface of first metal film 23, an opening is formed in the resist to form spacer 22, and plating is performed. Then, by removing the resist, it is possible to form spacer 22 on the surface of first metal film 23. It should be noted that it is possible to form more than one spacer 22 by forming multiple openings in the resist.

In Embodiment 1, first metal film 23 has first adhesion layer 23a, barrier layer 23b, and deterioration prevention layer 23c. First adhesion layer 23a, barrier layer 23b, and deterioration prevention layer 23c are disposed sequentially in the direction from submount main body 21 to spacer 22 and constitute a multi-layered film.

First adhesion layer 23a is a metal layer highly adhesive to submount main body 21 and, for example, a Ti layer made of Ti having a thickness of 0.1 μm. Barrier layer 23b is a metal layer for preventing Sn from diffusing and, for example, a Pt layer made of Pt having a thickness of 0.2 μm. Deterioration prevention layer 23c is a metal layer for preventing the quality of the surface of first metal film 23 from changing when forming spacer 22 by the copper plating and, for example, an Au layer made of Au having a thickness of 0.5 μm. Without deterioration prevention layer 23c, when forming spacer 22, the surface of first metal film 23 oxidizes and becomes a high-resistance portion, which may partially stop the progress of the plating and cause a void. It should be noted that in first metal film 23, barrier layer 23b does not have to be formed.

Spacer 22 is disposed between submount main body 21 and substrate 30. In Embodiment 1, submount main body 21 is provided with spacer 22 with first metal film 23 interposed therebetween. Specifically, spacer 22 is formed on the surface of deterioration prevention layer 23c of first metal film 23. In Embodiment 1, spacer 22 is a part of submount 20.

Two or more spacers 22 are provided. As illustrated in FIG. 10, spacers 22 are distributed two-dimensionally. In Embodiment 1, a total of four spacers 22 are provided, two spacers 22 being arranged in the longitudinal direction of submount 20, and two spacers 22 being arranged in the transverse direction of submount 20. Four spacers 22 are disposed near the four corners of submount main body 21. However, four spacers 22 are not disposed at the corners of submount main body 21. Thus, second main surface 21b of submount main body 21 has the corners without spacer 22.

Preferably, distance D1 between two adjacent spacers 22 (see FIG. 10) should be greater than or equal to 100 µm. Preferably, a side of spacer 22 should be apart from a side of submount main body 21. In this case, preferably, distance D2 between the side of spacer 22 and the side of submount main body 21 should be greater than or equal to 50 µm. Moreover, preferably, minimum width D3 of spacer 22 should be greater than or equal to 50 µm.

As illustrated in FIG. 9, spacer 22 has first surface S10, second surface S20, and third surface S30. First surface S10 faces second main surface 21b of submount main body 21. Second surface S20 is opposite to first surface S10. Third surface S30 is a side between first surface S10 and second surface S20. When spacer 22 is viewed from the side, first curved surface C1, which is a sloping surface, connects second surface S20 and third surface S30 to each other. Thus, a central portion of spacer 22 is thicker than a peripheral portion of spacer 22.

Figure 13:
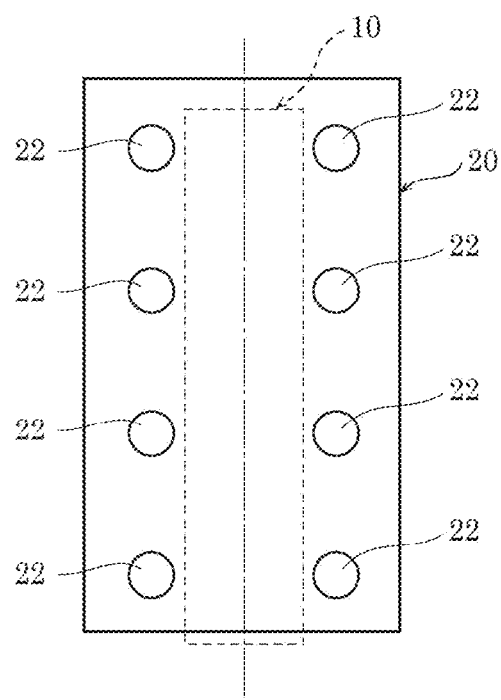
FIG. 13 is a bottom view of another example of the submount of the semiconductor light-emitting apparatus according to Embodiment 1.

As illustrated in FIG. 10, when submount 20 is viewed from the bottom, third surface S30 of spacer 22 has at least first side S31 and second side S32. In Embodiment 1, when submount 20 is viewed from the bottom, third surface S30 of spacer 22 has curved surfaces. Specifically, spacer 22 in bottom view has a long racetrack shape. Second curved surfaces C2 connect first side S31 and second side S32 to each other. Preferably, the curvature radius of second curved surface C2 should be greater than or equal to 25 µm. It should be noted that as illustrated in FIG. 13, spacer 22 in bottom view may be circular. In this case, spacer 22 is substantially cylindrical.

As illustrated in FIG. 9, second metal film 24 is disposed on second surface S20 of spacer 22. In Embodiment 1, second metal film 24 is also disposed on third surface S30 of spacer 22. Furthermore, second metal film 24 is disposed in second region R2 without spacer 22. Specifically, second metal film 24 is formed on the entire exposed surface of first metal film 23 and covers the entirety of second surface S20 and third surface S30 of spacer 22. It should be noted that in Embodiment 1, second metal film 24 is a part of submount 20.

In Embodiment 1, second metal film 24 has second adhesion layer 24a, barrier layer 24b, and surface layer 24c. Second adhesion layer 24a, barrier layer 24b, and surface layer 24c are disposed sequentially in the direction from submount main body 21 to substrate 30 and constitute a multi-layered film.

Second adhesion layer 24a is a metal layer highly adhesive to first metal film 23 (specifically, deterioration prevention layer 23c) and, for example, a Ti layer made of Ti having a thickness of 0.1 µm. Barrier layer 24b is a metal layer for preventing the Sn from diffusing and, for example, a Pt layer made of Pt having a thickness of 0.2 µm. Because of the presence of barrier layer 24b, it is possible to limit a portion in which second metal film 24 and second bonding material 42 become an alloy. Thus, submount main body 21 and substrate 30 can be reliably connected to each other. Surface layer 24c is a metal layer serving as a connection layer that makes an alloy together with second bonding material 42 and becomes one layer and, for example, an Au layer made of Au having a thickness of 0.5 µm.

Third metal film 25 is disposed on first main surface 21a of submount main body 21. Specifically, third metal film 25 is formed on entire first main surface 21a of submount main body 21. It should be noted that in Embodiment 1, third metal film 25 is a part of submount 20.

In Embodiment 1, third metal film 25 has third adhesion layer 25a, barrier layer 25b, and surface layer 25c. Third adhesion layer 25a, barrier layer 25b, and surface layer 25c are disposed sequentially in the direction from submount main body 21 to semiconductor laser 10 and constitute a multi-layered film.

Third adhesion layer 25a is a metal layer highly adhesive to submount main body 21 and, for example, a Ti layer made of Ti having a thickness of 0.1 µm. Barrier layer 25b is a metal layer for preventing the Sn from diffusing and, for example, a Pt layer made of Pt having a thickness of 0.2 µm. Surface layer 25c is a metal layer to which gold wire for supplying power to semiconductor laser 10 is connected and, for example, an Au layer made of Au having a thickness of 0.5 µm.

Fourth metal film 26 is formed on the surface of third metal film 25 (specifically, surface of surface layer 25c). Fourth metal film 26 is a metal film for preventing first bonding material 41 from getting into and spreading in third metal film 25 and is, for example, a Pt layer made of Pt having a thickness of 0.3 µm. Because of the provision of fourth metal film 26, it is possible to easily obtain a portion to form wire on the surface of third metal film 25. It should be noted that as first bonding material 41, for example, a solder layer made of AuSn solder having a thickness of 2 µm to 3 µm is formed on the surface of fourth metal film 26. Specifically, in FIG. 11, first bonding material 41 between p-side electrode 16 and fourth metal film 26 has a thickness of 2 µm to 3 µm. In FIG. 12, first bonding material 41 between n-side electrode 17 and fourth metal film 26 has a thickness of 2 µm to 3 µm.

Submount 20 having the above configuration is bonded to substrate 30 by covering at least a portion of second region R2 with second bonding material 42. In this case, second bonding material 42 substantially fills the space between at least two spacers 22.

Second bonding material 42 in plan view extends outwardly from submount 20 on substrate 30. In Embodiment 1, second bonding material 42 covers at least a portion of the sides of submount 20.

As discussed above, the lower limit of the thickness of second bonding material 42 is determined by the following formula. Specifically, the following Expressions 1 and 2 are satisfied, where d (m) is the average thickness of second bonding material 42 in contact with second region R2 of submount 20, $\Delta T$ (K) is a temperature change range ensured in semiconductor light-emitting apparatus 1, $\alpha_{sub}$ ($K^{-1}$) is the thermal expansion coefficient of the base material (submount main body 21) of submount 20, $\alpha_{stem}$ ($K^{-1}$) is the thermal expansion coefficient of substrate 30, Z (GPa) is the modulus of elasticity of second bonding material 42, W (m) is the width of submount 20 (submount main body 21), L (m) is the length of submount 20 (submount main body 21), and C (GN/m) is the crack-occurrence critical constant of second bonding material 42.

[Math. 6]

$$\Delta T \cdot (a_{stem} - a_{sub}) \cdot Z \cdot \left( \frac{\frac{W}{2} \cdot \frac{L}{2}}{d} \right) \leq C \quad \text{(Expression 1)}$$

[Math. 7]

$$C = 3 \times 10^{-3} \quad \text{(Expression 2)}$$

It should be noted that average thickness d is the average value of the thickness of second bonding material 42 in contact with second region R2 without spacer 22, measured across 100 μm or more in a cross section that includes submount 20 and substrate 30 of semiconductor light-emitting apparatus 1. The surface of substrate 30 or submount 20 is not flat and has projections and depressions. In particular, the surface of substrate 30 on the side on which submount 20 is mounted has projections and depressions of around positive and negative 3 μm. Thus, to remove the effects of the projections and the depressions, the average value in the 100-μm-or-more range is used as the thickness of second bonding material 42.

As the material of second bonding material 42, preferably, hard solder having high mechanical strength should be used. As the hard solder, an Au-based alloy, such as AuSn, AuGe, AuSi, or AuSb, can be used. Among the Au-based alloys, AuSn having a relatively low melting point is preferable. This is because it is possible to reduce thermal strain caused before the temperature of the bonding material that has melted at a high temperature and solidified decreases to room temperature.

When second bonding material 42 is made of AuSn, in the above Expression 1, second bonding material 42 has Z of 22.7 GPa, Z being a modulus of elasticity. Thus, when the material of second bonding material 42 is limited to the AuSn, the crack-occurrence critical constant is expressed as D (m). Here, the following Expressions 3 and 4 are satisfied.

[Math. 8]

$$\Delta T \cdot (a_{stem} - a_{sub}) \cdot \left( \frac{\frac{W}{2} \cdot \frac{L}{2}}{d} \right) \leq D \quad \text{(Expression 3)}$$

[Math. 9]

$$D = 1.32 \times 10^{-4} \quad \text{(Expression 4)}$$

It should be noted that the upper limit of thickness d of second bonding material 42 is not limited to a particular value but should preferably be less than or equal to 40 μm. For instance, when a thickness of second bonding material 42 of 10 μm (d=10 μm) is set to a proper value, and second bonding material 42 is thicken to a thickness of 40 μm (d=40 μm), thermal resistance increases by 1 K/W. The amount of increase in the thermal resistance is sufficient enough to decrease laser characteristics.

Substrate 30 is boned to submount 20 with second bonding material 42 interposed therebetween. Preferably, the thermal conductivity of substrate 30 should be greater than 200 W·m⁻¹·K⁻¹. In Embodiment 1, substrate 30 is made of copper (Cu). Specifically, both of stem base 31 and stem post 32 are made of copper.

Metal film 50 is formed on a portion of substrate 30 to which submount 20 is bonded. Specifically, metal film 50 is formed on the surface of stem post 32. In Embodiment 1, metal film 50 has ground layer 50a and surface layer 50b.

Ground layer 50a is a metal layer serving as the ground of surface layer 50b and, for example, an Ni layer made of Ni. Surface layer 50b formed on ground layer 50a is a metal layer serving as a connection layer that makes an alloy together with second bonding material 42 and becomes one layer and, for example, an Au layer made of Au. Surface layer 50b can be formed on the surface of ground layer 50a by, for example, gold plating.

Figure 14:
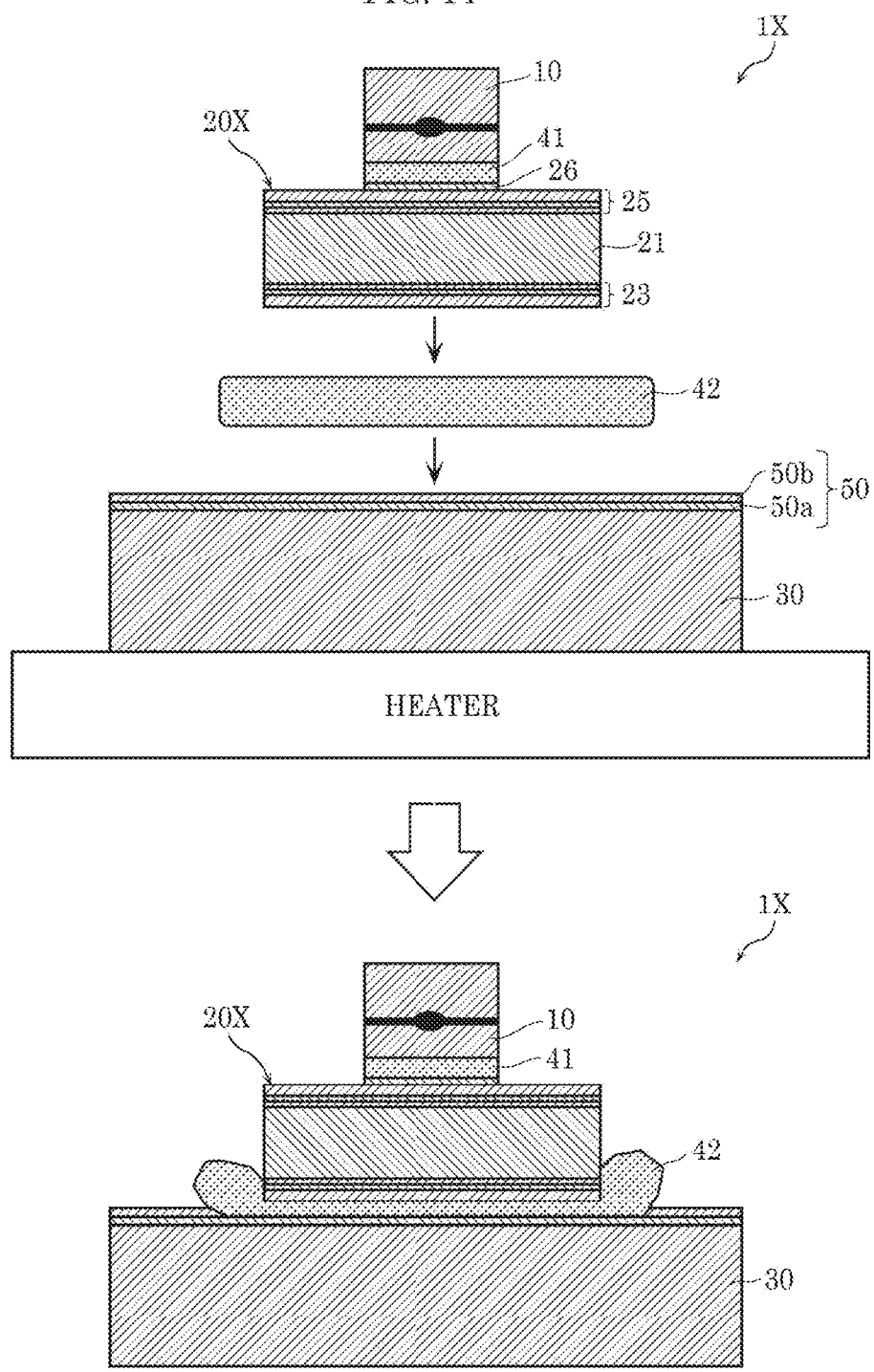
FIG. 14 illustrates a method of fabricating a semiconductor light-emitting apparatus in a comparison example.

Next, the method of fabricating semiconductor light-emitting apparatus 1 in Embodiment 1 is described, while comparing with the method of fabricating semiconductor light-emitting apparatus 1X in the comparison example illustrated in FIG. 14.

As illustrated in FIG. 14, spacer 22 and second metal film 24, which are formed in submount 20 of semiconductor light-emitting apparatus 1 in Embodiment 1, are not formed in submount 20X of semiconductor light-emitting apparatus 1X in the comparison example.

When fabricating semiconductor light-emitting apparatus 1X in the comparison example, second bonding material 42 is disposed between substrate 30 and submount 20X, to which semiconductor laser 10 is bonded with first bonding material 41 interposed therebetween. When second bonding material 42 is heated with a heater and melts, then submount 20X is pressed against substrate 30. Subsequently, by cooling second bonding material 42, it is possible to bond submount 20X and substrate 30 to each other with second bonding material 42. Since submount 20X does not have spacer 22, second bonding material 42 that has melted is squashed by submount 20X, which makes second bonding material 42 between submount 20X and substrate 30 thinner. Thus, it is difficult to form thick second bonding material 42.

Hereinafter, with reference to FIGS. 15A to 15C, the method of fabricating semiconductor light-emitting apparatus 1 according to Embodiment 1 is described.

As illustrated in FIG. 15A, semiconductor laser 10 is mounted above submount 20. Specifically, semiconductor laser 10 is disposed above submount 20 on which first bonding material 41 is disposed in advance. Then, by causing a (not-illustrated) heater to heat and melt first bonding material 41, semiconductor laser 10 and submount 20 are connected to each other with first bonding material 41 interposed therebetween. Here, Au layer 19 should be formed on the mounting surface of semiconductor laser 10. This enables Au layer 19 and first bonding material 41 to easily become one layer, which enables bonding of semiconductor laser 10 and submount 20.

Then, as illustrated in FIG. 15B, in the state in which second main surface 21b of submount main body 21 is oriented toward substrate 30, submount 20 is disposed above substrate 30 with melted second bonding material 42 interposed therebetween. Specifically, second bonding material 42 is disposed between submount 20 and substrate 30. When second bonding material 42 is heated with a heater and melts, submount 20 is pressed against substrate 30.

In the method of fabricating semiconductor light-emitting apparatus 1 in Embodiment 1, since submount 20 is provided with spacer 22, second bonding material 42 is not squashed in a portion without spacer 22. Thus, it is possible to easily form thick second bonding material 42.

Then, by cooling melted second bonding material 42, submount 20 is fixed to substrate 30. In this manner, semiconductor light-emitting apparatus 1 as illustrated in FIG. 15C can be fabricated.

Thus, in semiconductor light-emitting apparatus 1 in Embodiment 1, because of the provision of spacer 22 in submount 20, it is possible to control the thickness of second bonding material 42 and obtain a target thickness.

As discussed above, semiconductor light-emitting apparatus 1 according to Embodiment 1 includes: substrate 30; submount 20 above substrate 30; and semiconductor laser 10 above submount 20. Semiconductor laser 10 and submount 20 are bonded to each other with first bonding material 41. Substrate 30 and submount 20 are bonded to each other with second bonding material 42. Submount 20 has first region R1 and second region R2 near substrate 30, first region R1 being a region on which spacer 22 is disposed, and second region R2 being a region without spacer 22. Submount 20 is bonded to substrate 30 by covering at least a portion of second region R2 with second bonding material 42.

Thus, because of the presence of spacer 22, it is possible to control the thickness of second bonding material 42 between submount 20 and substrate 30 and obtain a target thickness. This makes it possible to accurately obtain the thickness of second bonding material 42 that ensures sufficient strength against thermal strain caused by the temperature cycle. In addition, it is possible to easily interpose second bonding material 42 between submount 20 and substrate 30 without a gap. Accordingly, it is possible to fabricate semiconductor light-emitting apparatus 1 that has sufficient strength against thermal strain caused by the temperature cycle and in which an increase in thermal resistance is suppressed.

In semiconductor light-emitting apparatus 1 according to Embodiment 1, the following Expressions 1 and 2 are satisfied, where d (m) is the average thickness of second bonding material 42 in contact with second region R2 of submount 20, $\Delta T$ (K) is a temperature change range ensured in semiconductor light-emitting apparatus 1, $\alpha_{sub}$ (K$^{-1}$) is the thermal expansion coefficient of the base material of submount 20, $\alpha_{stem}$ (K$^{-1}$) is the thermal expansion coefficient of substrate 30, Z (GPa) is the modulus of elasticity of second bonding material 42, W (m) is the width of submount 20, L (m) is the length of submount 20, and C (GN/m) is the crack-occurrence critical constant of second bonding material 42.

[Math. 10]

$$\Delta T \cdot (a_{stem} - a_{sub}) \cdot Z \cdot \left( \frac{\frac{W}{2} \cdot \frac{L}{2}}{d} \right) \leq C \quad \text{(Expression 1)}$$

[Math. 11]

$$C = 3 \times 10^{-3} \quad \text{(Expression 2)}$$

Thus, it is possible to suppress a crack from occurring in second bonding material 42 due to the temperature cycle.

In semiconductor light-emitting apparatus 1 according to Embodiment 1, second bonding material 42 is made of AuSn. In this case, the following Expressions 3 and 4 are satisfied, where D (m) is the crack-occurrence critical constant of second bonding material 42 made of the AuSn.

[Math. 12]

$$\Delta T \cdot (a_{stem} - a_{sub}) \cdot \left( \frac{\frac{W}{2} \cdot \frac{L}{2}}{d} \right) \leq D \quad \text{(Expression 3)}$$

[Math. 13]

$$D = 1.32 \times 10^{-4} \quad \text{(Expression 4)}$$

Thus, when second bonding material 42 is made of the AuSn solder, it is possible to reliably suppress a crack from occurring in second bonding material 42 due to the temperature cycle.

In semiconductor light-emitting apparatus 1 according to Embodiment 1, submount 20 has submount main body 21, and submount main body 21 is provided with spacer 22.

Thus, spacer 22 can be easily disposed.

In semiconductor light-emitting apparatus 1 according to Embodiment 1, two or more spacers 22 are provided.

Thus, it is possible to increase the degree of parallelism between the surface of submount 20 and the surface of substrate 30 and decrease the inclination of submount 20 relative to substrate 30. In addition, it is possible to suppress variations in the thickness of second bonding material 42.

In semiconductor light-emitting apparatus 1 according to Embodiment 1, second bonding material 42 substantially fills the space between at least two spacers 22.

Thus, it is possible to increase a heat dissipation area extending from submount 20 to substrate 30. That is, the space between two adjacent spacers 22, filled with second bonding material 42 can serve as a heat dissipation path. Thus, thermal resistance between submount 20 and substrate 30 can be decreased. In addition, by filling the space between two adjacent spacers 22 with second bonding material 42, the strength of bonding of submount 20 and substrate 30 can be increased.

In semiconductor light-emitting apparatus 1 according to Embodiment 1, spacers 22 are distributed two-dimensionally.

Thus, it is possible to avoid concentration of thermal strain on one spacer 22 and split thermal strain among spacers 22. In addition, the distribution of thermal resistance between submount 20 and substrate 30 can be equalized. Thus, it is possible to avoid thermal strain being partially high.

In semiconductor light-emitting apparatus 1 according to Embodiment 1, distance D1 between two adjacent spacers 22 is greater than or equal to 100 µm.

Thus, second bonding material 42 can easily get into the space between two adjacent spacers 22, which can further decrease thermal resistance between submount 20 and substrate 30.

In semiconductor light-emitting apparatus 1 according to Embodiment 1, submount main body 21 is cuboid, at least four spacers 22 are disposed, and four of at least four spacers 22 are disposed near the four corners of submount main body 21.

Thus, it is possible to increase the degree of parallelism between the surface of submount 20 and the surface of substrate 30 and decrease the inclination of submount 20 relative to substrate 30. In addition, it is possible to suppress variations in the thickness of second bonding material 42.

In semiconductor light-emitting apparatus 1 according to Embodiment 1, second main surface 21b (surface near substrate 30) of submount main body 21 has corners without spacer 22.

Thus, when submount 20 is viewed from the bottom, spacers 22 can be formed within second main surface 21b of submount main body 21. Thus, when making submount 20 (dividing submount 20), it is possible to suppress damage to spacers 22.

In addition, in semiconductor light-emitting apparatus 1 according to Embodiment 1, a side of spacer 22 is apart from a side of submount main body 21.

Thus, when making submount 20, it is possible to easily cut out submount 20 without damaging spacer 22. Spacer 22 can be easily formed within second main surface 21b of submount main body 21 when submount 20 is viewed from the bottom.

In this case, preferably, distance D2 between the side of spacer 22 and the side of submount main body 21 should be greater than or equal to 50 µm.

Thus, when making submount 20, spacer 22 can be formed more reliably within second main surface 21b of submount main body 21 when submount 20 is viewed from the bottom.

In addition, in semiconductor light-emitting apparatus 1 according to Embodiment 1, preferably, the central portion of spacer 22 should be thicker than the peripheral portion of spacer 22.

Thus, when mounting submount 20 above substrate 30, it is possible to suppress a void from occurring between the surface of spacer 22 and second bonding material 42. This can suppress thermal resistance between submount 20 and substrate 30 from increasing. In addition, in the end portion of spacer 22, it is possible to moderate a change in the thickness of spacer 22 and a change in the thickness of second bonding material 42. Hence, it is possible to avoid a portion in which material characteristics abruptly change being caused. This can suppress second bonding material 42 from breaking during the temperature cycle.

In semiconductor light-emitting apparatus 1 according to Embodiment 1, spacer 22 has first surface S10, second surface S20, and third surface S30. First surface S10 faces second main surface 21b of submount main body 21. Second surface S20 is opposite to first surface S10. Third surface S30 is a side between first surface S10 and second surface S20.

In this case, as discussed in Embodiment 1, first curved surface C1 should connect second surface S20 and third surface S30 to each other.

Thus, in the end portion of spacer 22, it is possible to moderate a change in the thickness of spacer 22 and a change in the thickness of second bonding material 42. Hence, it is possible to avoid a portion in which material characteristics abruptly change being caused. This can suppress second bonding material 42 from breaking during the temperature cycle.

In addition, preferably, third surface S30 should have a curved surface.

Thus, the corners of spacer 22 look round when viewed in the normal direction of second main surface 21b of submount main body 21. Hence, it is possible to avoid a portion in which material characteristics abruptly change being caused. This can further suppress second bonding material 42 from breaking during the temperature cycle.

Third surface S30 has at least first side S31 and second side S32, and second curved surface C2 connects first side S31 and second side S32 to each other.

Thus, the corners of spacer 22 look round when viewed in the normal direction of second main surface 21b of submount main body 21. Hence, it is possible to avoid a portion in which material characteristics abruptly change being caused. This can further suppress second bonding material 42 from breaking during the temperature cycle.

In this case, preferably, the curvature radius of second curved surface C2 should be greater than or equal to 25 µm.

This ensures that the corners of spacer 22 look round when viewed in the normal direction of second main surface 21b of submount main body 21. Hence, it is possible to reliably avoid a portion in which material characteristics abruptly change being caused. This can suppress second bonding material 42 from breaking during the temperature cycle.

In semiconductor light-emitting apparatus 1 according to Embodiment 1, preferably, minimum width D3 of spacer 22 should be greater than or equal to 50 µm. For instance, when spacer 22 in bottom view is circular, preferably, the diameter of spacer 22 should be greater than or equal to 50 µm.

Thus, it is possible to reliably avoid a portion in which material characteristics abruptly change being caused. This can suppress second bonding material 42 from breaking during the temperature cycle. In addition, since it is possible to reliably form a flat surface on the surface of spacer 22, a predetermined thickness of spacer 22 can be reliably obtained. This can further suppress second bonding material 42 from breaking due to the temperature cycle.

In semiconductor light-emitting apparatus 1 according to Embodiment 1, in first region R1, first metal film 23 is formed between spacer 22 and second main surface 21b of submount main body 21.

Thus, it is possible to increase the mechanical strength of the connection portion of submount main body 21 and spacer 22.

In semiconductor light-emitting apparatus 1 according to Embodiment 1, first metal film 23 is also disposed in second region R2.

Thus, it is possible to suppress a void and foreign matter from occurring in second region R2.

In semiconductor light-emitting apparatus 1 according to Embodiment 1, first metal film 23 has first adhesion layer 23a and deterioration prevention layer 23c, and first adhesion layer 23a and deterioration prevention layer 23c are disposed sequentially in the direction from submount main body 21 to spacer 22.

By forming first adhesion layer 23a, it is possible to increase the mechanical strength of the connection portion of submount main body 21 and spacer 22. Moreover, by forming deterioration prevention layer 23c, when forming spacer 22, it is possible to prevent a void from occurring in spacer 22 and prevent foreign matter from getting into spacer 22.

In semiconductor light-emitting apparatus 1 according to Embodiment 1, second metal film 24 is disposed on second surface S20 of spacer 22.

Thus, it is possible to easily bond spacer 22 to substrate 30 with second bonding material 42.

In Embodiment 1, second metal film 24 is also disposed on third surface S30 of spacer 22.

This facilitates bonding of third surface S30 (sides) of spacer 22 and substrate 30 to each other with second bonding material 42 interposed therebetween. Thus, it is possible to easily connect submount 20 and substrate 30 to each other.

In Embodiment 1, second metal film 24 is also disposed in second region R2 without spacer 22.

Thus, even in second region R2 without spacer 22, it is possible to easily connect submount 20 and substrate 30 to each other with second bonding material 42 interposed therebetween.

In semiconductor light-emitting apparatus 1 according to Embodiment 1, the main ingredient of spacer 22 is a metal selected from Cu, Al, Au, and Ag or an alloy including at least one of Cu, Al, Au, and Ag.

Thus, a heat dissipation path is not limited to second region R2 without spacer 22 (that is, region in which second bonding material 42 is present) but also includes first region R1 on which spacer 22 is disposed. This can further decrease thermal resistance between submount 20 and substrate 30.

In semiconductor light-emitting apparatus 1 according to Embodiment 1, second bonding material 42 in plan view extends outwardly from submount 20 on substrate 30.

Since almost entire interfaces between submount 20 and substrate 30 are connected to each other with second bonding material 42, the connection area of submount 20 and substrate 30 is large. This can further decrease thermal resistance between submount 20 and substrate 30.

In semiconductor light-emitting apparatus 1 according to Embodiment 1, second bonding material 42 covers at least a portion of each of the sides of submount 20.

Thus, a portion of each of the sides of submount 20 can be used as a heat dissipation path, which enables the connection area of submount 20 and substrate 30 to be further increased. This can further decrease thermal resistance between submount 20 and substrate 30.

In semiconductor light-emitting apparatus 1 according to Embodiment 1, first bonding material 41 is thinner than second bonding material 42.

Since semiconductor laser 10 and submount 20 (submount main body 21) that have a small difference in the thermal expansion coefficient are bonded to each other with thin first bonding material 41, thermal resistance between semiconductor laser 10 and submount 20 is low. Meanwhile, since submount 20 and substrate 30 that have a large difference in the thermal expansion coefficient are bonded to each other with thick second bonding material 42, it is possible to suppress a crack from occurring in second bonding material 42 due to the temperature cycle. That is, it is possible to obtain both temperature cycle resistance and low thermal resistance.

In semiconductor light-emitting apparatus 1 according to Embodiment 1, the area of the surface of submount 20 near substrate 30 is greater than or equal to 0.6 mm². Specifically, the area of second main surface 21b of submount main body 21 is greater than or equal to 0.6 mm².

Thus, it is possible to obtain both temperature cycle resistance and low thermal resistance in high-output-power semiconductor laser 10 in which large submount 20 should be used.

In semiconductor light-emitting apparatus 1 according to Embodiment 1, a decrease of optical output power for an operating current If after a temperature cycle test is at most 20% of optical output power for the operating current If before the temperature cycle test, the temperature cycle test being a test in which a temperature cycle from 125 degrees Celsius to negative 40 degrees Celsius is repeated 1,000 times.

Thus, it is possible to meet the reliability test standard AEC-Q102 for vehicle components. Accordingly, semiconductor light-emitting apparatus 1 according to Embodiment 1 can be used as the light source of a vehicle, such as the light source of a vehicle headlamp.

In semiconductor light-emitting apparatus 1 according to Embodiment 1, the thermal conductivity of the base material of submount 20 is greater than or equal to 130 $W·m^{-1}·K^{-1}$.

Thus, it is possible to further decrease the thermal resistance of semiconductor light-emitting apparatus 1.

In semiconductor light-emitting apparatus 1 according to Embodiment 1, the thermal expansion coefficient of the base material of submount 20 is less than or equal to $5 \times 10^{-6}$ $K^{-1}$.

Thus, more materials are selectable as the base material of submount 20 (material of submount main body 21). Hence, it is possible to easily obtain both temperature cycle resistance and low thermal resistance.

In semiconductor light-emitting apparatus 1 according to Embodiment 1, preferably, the thermal conductivity of substrate 30 should be greater than 200 $W·m^{-1}·K^{-1}$.

Thus, it is possible to further decrease the thermal resistance of semiconductor light-emitting apparatus 1.

In semiconductor light-emitting apparatus 1 according to Embodiment 1, a difference in the thermal expansion coefficient between the base material of submount 20 and substrate 30 is greater than $11 \times 10^{-6}$ $K^{-1}$.

Thus, more materials are selectable as the base material of submount 20 (material of submount main body 21). Hence, it is possible to easily obtain both temperature cycle resistance and low thermal resistance.

In semiconductor light-emitting apparatus 1 according to Embodiment 1, semiconductor laser 10 operates in a state in which a difference between power consumption and optical output power is greater than or equal to 3 W.

This enables efficient dissipation for large heat generation caused due to the low thermal resistance, which enables high-output operation of the semiconductor laser.

It should be noted that when depressions are formed on the surface of substrate 30, preferably, the thickness of spacer 22 should be greater than the depth of each of the depressions.

Thus, the depressions on the surface of substrate 30 are mostly filled with second bonding material 42, which can increase the strength of bonding of submount 20 and substrate 30.

Figure 15C:
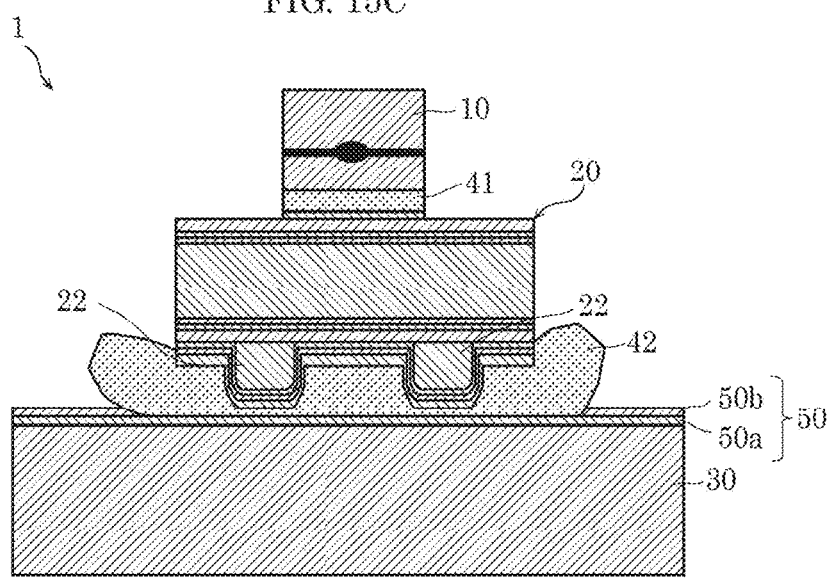
FIG. 15C illustrates the semiconductor light-emitting apparatus fabricated by mounting the submount, above which the semiconductor laser is mounted, above the substrate in the method of fabricating the semiconductor light-emitting apparatus according to Embodiment 1.

As illustrated in FIGS. 15A to 15C, the method of fabricating semiconductor light-emitting apparatus 1 according to Embodiment 1 includes: mounting semiconductor laser 10 (laser chip) near first main surface 21a of submount 20 (mounting the chip on the submount); disposing submount 20 above substrate 30 with melted second bonding material 42 interposed therebetween in the state in which second main surface 21b provided with spacer 22 is oriented toward substrate 30; and cooling melted second bonding material 42 to fix submount 20 to substrate 30.

By fabricating semiconductor light-emitting apparatus 1 in this manner, it is possible to easily fabricate semiconductor light-emitting apparatus 1 that has sufficient strength against thermal strain caused by the temperature cycle and in which an increase in thermal resistance is suppressed.

It should be noted that when mounting the chip on the submount as illustrated in FIG. 15A, by heating from the side on which second main surface 21b (back side) of submount 20 is present with a heater, first bonding material 41 (AuSn solder) pre-formed near first main surface 21a of submount 20 melts. Then, semiconductor laser 10 is mounted above submount 20. In this manner, semiconductor laser 10 is boned to submount 20 with first bonding material 41 interposed therebetween.

Figure 16:
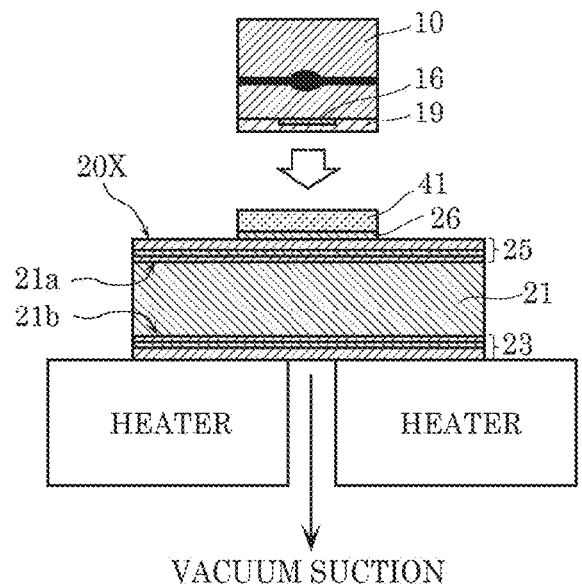
FIG. 16 illustrates mounting of the semiconductor laser above a submount without a spacer.
Figure 17:
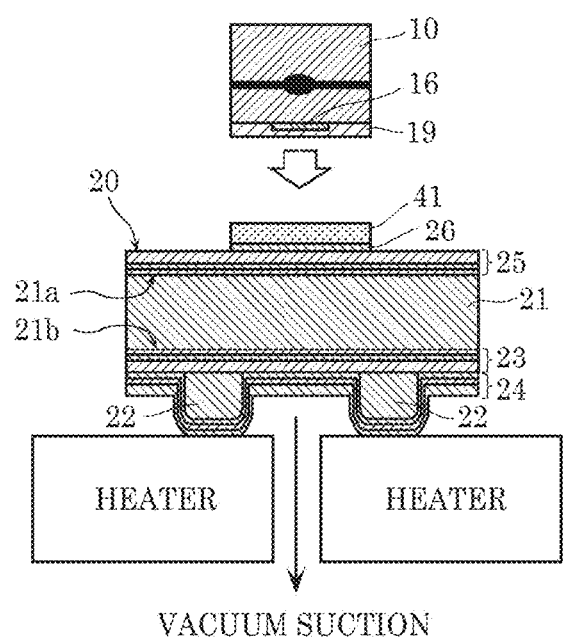
FIG. 17 illustrates mounting of the semiconductor laser above a submount provided with spacers.

Here, as illustrated in FIG. 16, when submount 20X without spacer 22 is used, the area in which submount 20X and a heater are in contact with each other is large, which enables submount 20X to be easily heated. Meanwhile, in Embodiment 1, as illustrated in FIG. 17, submount 20 provided with spacers 22 is used. Thus, compared with when submount 20X in FIG. 16 is used, the area in which submount 20 and a heater are in contact with each other is small. Thus, in Embodiment 1, a heat conduction path in the direction from second main surface 21b of submount 20 (surface near heater) to first main surface 21a is narrow. This makes it difficult to heat and melt first bonding material 41 (AuSn solder) formed near first main surface 21a of submount 20.

Figure 18:
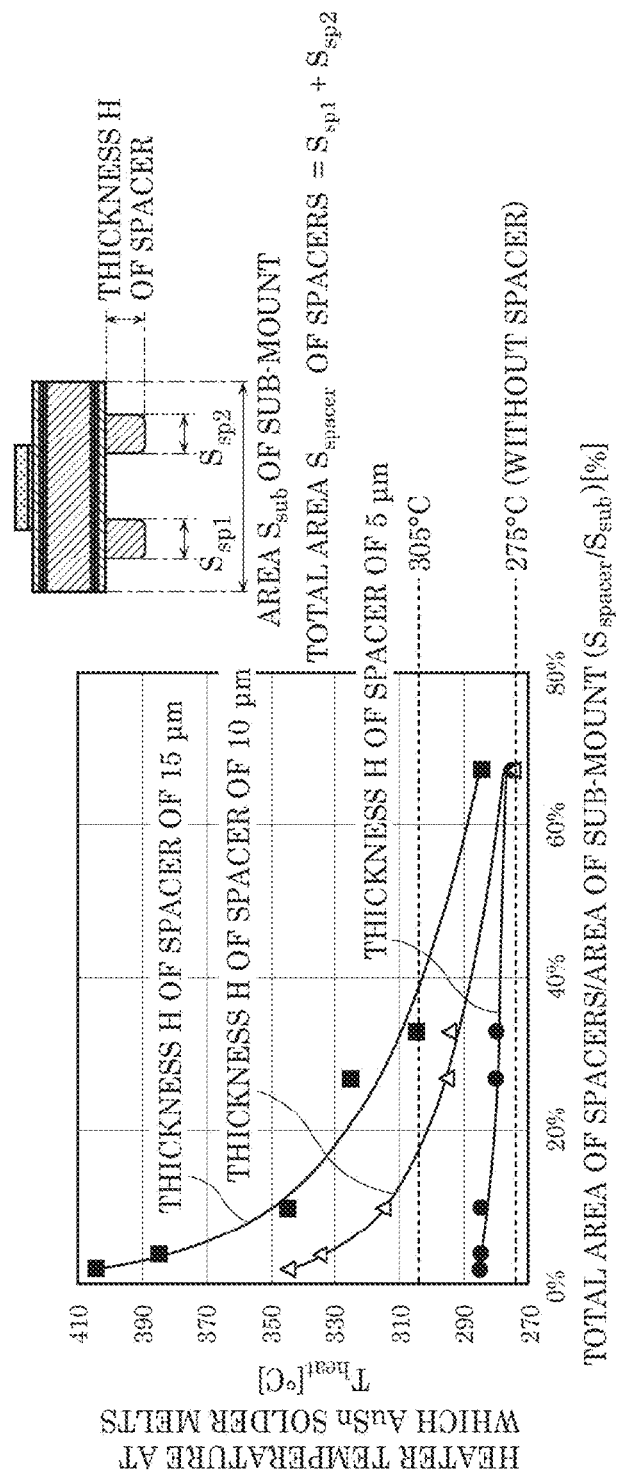
FIG. 18 illustrates the effects of the thickness and the area of a spacer on melting of AuSn solder formed on the submount when melting the AuSn solder to mount the semiconductor laser above the submount.

In view of the foregoing, regarding submount 20 having spacer 22, the inventors of the present application studied the effects of spacer 22 formed near second main surface 21b on the AuSn solder formed near first main surface 21a. Specifically, the size of the area of spacer 22 was changed in each of the cases: H=5 μm, H=10 μm, and H=15 μm, where H is the thickness (height) of spacer 22 of submount 20. Then, the inventors measured heater temperatures at which the AuSn solder formed near first main surface 21a melts. FIG. 18 illustrates the results.

It should be noted that in FIG. 18, the vertical axis denotes heater temperature $T_{heat}$ (degrees Celsius) at which the AuSn solder melts, and the horizontal axis denotes an area ratio ($S_{spacer}/S_{sub}$) that is the ratio of total area $S_{spacer}$ of spacers 22 to area $S_{sub}$ of submount 20. It should be noted that area $S_{sub}$ of submount 20 is the projection area of whole submount 20 obtained when submount 20 is projected on a plane from the back side of submount 20 (second main surface 21b). In addition, total area $S_{spacer}$ of spacers 22 denotes the total of the projection areas of all spacers 22 obtained when only spacers 22 are projected on a plane from the back side of submount 20 (second main surface 21b).

As illustrated in FIG. 18, the area ratio ($S_{spacer}/S_{sub}$), which is the ratio of total area $S_{spacer}$ of spacers 22 to area $S_{sub}$ of submount 20, decreases with the reduction of the areas of spacers 22. This increases the heater temperature at which the AuSn solder formed on the side opposite to the heater melts. In particular, the heater temperature at which the AuSn solder melts significantly increases with an increase in thickness H of spacer 22.

Accordingly, when using submount 20 having spacers 22, to efficiently melt first bonding material 41 (AuSn solder) formed near first main surface 21a opposite to second main surface 21b, that is, the side on which the heater is disposed, spacer 22 should be as thin as possible, and the total area of spacers 22 should be as large as possible.

Specifically, when using submount 20X without spacer 22, the heater temperature at which the AuSn solder formed on the side opposite to the heater melts is 275 degrees Celsius. Thus, when using submount 20 provided with spacers 22, a practical heater temperature should be a temperature up to around 30 degrees Celsius higher than 275 degrees Celsius, that is, a temperature up to 305 degrees Celsius.

This is because when the heater temperature exceeds 305 degrees Celsius, a practical range may be exceeded. For instance, controlling of a temperature profile may become difficult. It may take too much time for the AuSn solder to melt. Semiconductor laser 10 (laser chip) may be exposed to a high temperature for too long.

Thus, when using submount 20 provided with spacers 22, area $S_{sub}$ of submount 20, total area $S_{spacer}$ of spacers 22, and thickness H of spacer 22 should be set to enable the heater temperature at which the AuSn solder formed on the side opposite to the heater melts to be lower than or equal to 305 degrees Celsius.

Here, the inventors of the present application underwent an experiment to study a relationship between the thickness and area of spacer 22 of submount 20 and the degradation of the laser characteristics of semiconductor laser 10. Specifically, using thickness H of spacer 22 of submount 20 and the area ratio ($S_{spacer}/S_{sub}$) as parameters, the inventors fabricated semiconductor light-emitting apparatuses (devices) and then conducted temperature cycle tests (1,000 times). Table 3 illustrates the results of the experiment. It should be noted that copper spacers are used as spacers 22.

TABLE 3

| Submount | | | Cu spacer | | Temperature cycle test | | Stem (substrate) | | Submount | | Modulus of elasticity of AuSn solder $Z_{AuSn}$ (GPa) | Critical thickness of solder*2 ($\times 10^{-6}$ m) | Result of temperature cycle test |
|---|---|---|---|---|---|---|---|---|---|---|---|---|---|
| Length (L) ($\times 10^{-3}$ m) | Width (W) ($\times 10^{-3}$ m) | | Thickness (H) ($\times 10^{-6}$ m) | Area ratio*1 $S_{spacer}/S_{sub}$ (%) | Highest temperature (° C.) | Lowest temperature (° C.) | Material | Thermal expansion coefficient $\alpha_{stem}$ ($\times 10^{-6}$ K$^{-1}$) | Material | Thermal expansion coefficient $\alpha_{ssub}$ ($\times 10^{-6}$ K$^{-1}$) | | | |
| 1.76 | 0.61 | | 5 | 66.9 | 125 | −40 | Cu | 16.8 | Diamond | 2.2 | 22.7 | 4.9 | x |
| 1.76 | 0.61 | | 5 | 32.8 | 125 | −40 | Cu | 16.8 | Diamond | 2.2 | 22.7 | 4.9 | x |
| 1.76 | 0.61 | | 5 | 26.7 | 125 | −40 | Cu | 16.8 | Diamond | 2.2 | 22.7 | 4.9 | x |
| 1.76 | 0.61 | | 5 | 9.8 | 125 | −40 | Cu | 16.8 | Diamond | 2.2 | 22.7 | 4.9 | x |
| 1.76 | 0.61 | | 5 | 3.7 | 125 | −40 | Cu | 16.8 | Diamond | 2.2 | 22.7 | 4.9 | o |
| 1.76 | 0.61 | | 10 | 66.9 | 125 | −40 | Cu | 16.8 | Diamond | 2.2 | 22.7 | 4.9 | x |
| 1.76 | 0.61 | | 10 | 32.8 | 125 | −40 | Cu | 16.8 | Diamond | 2.2 | 22.7 | 4.9 | x |
| 1.76 | 0.61 | | 10 | 26.7 | 125 | −40 | Cu | 16.8 | Diamond | 2.2 | 22.7 | 4.9 | o |
| 1.76 | 0.61 | | 15 | 66.9 | 125 | −40 | Cu | 16.8 | Diamond | 2.2 | 22.7 | 4.9 | o |
| 1.76 | 0.61 | | 15 | 32.8 | 125 | −40 | Cu | 16.8 | Diamond | 2.2 | 22.7 | 4.9 | o |
| 1.76 | 0.61 | | 15 | 26.7 | 125 | −40 | Cu | 16.8 | Diamond | 2.2 | 22.7 | 4.9 | o | o absence of degradation
x presence of degradation
*1area ratio = total area of spacers/bottom area of submount × 100
*2thickness d of solder at which left side of Expression 1 = 3 × 10$^{-3}$ (GN/m)

In table 3, the plotted circles denote the absence of degradation in the laser characteristics after conducting the temperature cycle test 1,000 times, and the plotted crosses denote the presence of degradation in the laser characteristics after conducting the temperature cycle test 1,000 times.

Thus, when using submount 20 having spacers 22, to suppress the laser characteristics of semiconductor laser 10 from deteriorating, thickness H of spacer 22 should be as large as possible, and total area $S_{spacer}$ of spacers 22 should be as small as possible.

Hence, when using submount 20 having spacers 22, to efficiently melt first bonding material 41 (AuSn solder), thickness H of spacer 22 should be as small as possible, and total area $S_{spacer}$ of spacers 22 should be as large as possible. Meanwhile, to suppress the laser characteristics of semiconductor laser 10 from deteriorating, thickness H of spacer 22 should be as large as possible, and total area $S_{spacer}$ of spacers 22 should be as small as possible.

Figure 19:
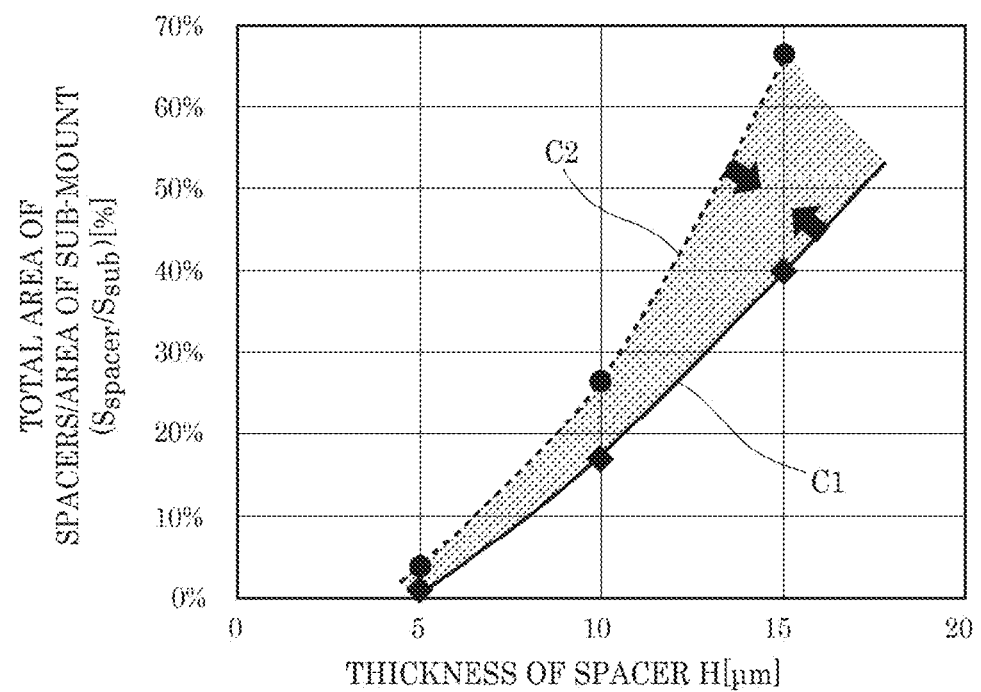
FIG. 19 illustrates a size range defined by the thickness and the area of the spacer that ensures both easiness to melt the AuSn solder when mounting the chip on the submount and suppression effects of degradation of the laser characteristics of the semiconductor laser.

Specifically, to ensure both easiness to melt the AuSn solder when mounting the chip on the submount and suppression effects of degradation in the laser characteristics of semiconductor laser 10, the size of each of area $S_{sub}$ of submount 20, total area $S_{spacer}$ of spacers 22, and thickness H of spacer 22 should be set to fall within the range between curved line C1 and curved line C2 in FIG. 19.

It should be noted that in FIG. 19, in the region above curved line C1, it is possible to easily melt the AuSn solder when mounting the chip on the submount, and in the region below curved line C2, it is possible to suppress the laser characteristics of semiconductor laser 10 from deteriorating.
(Variation of Embodiment 1)

Figure 20:
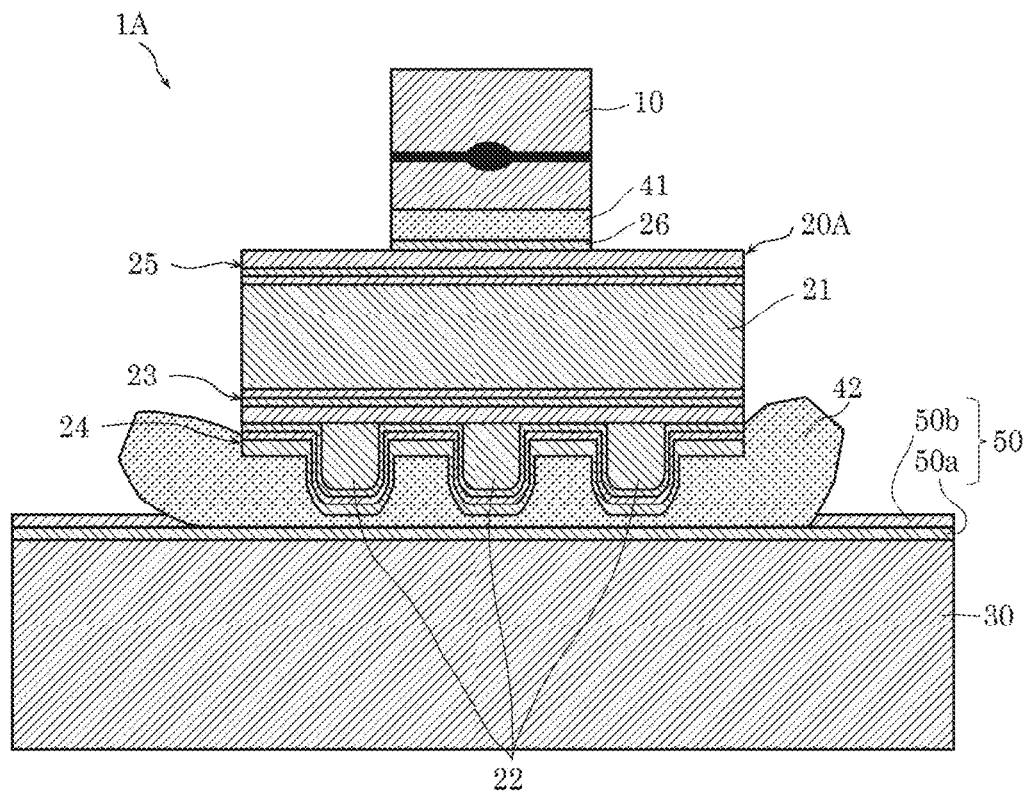
FIG. 20 is a cross-sectional view and illustrates a configuration of a semiconductor light-emitting apparatus according to a variation of Embodiment 1.
Figure 21:
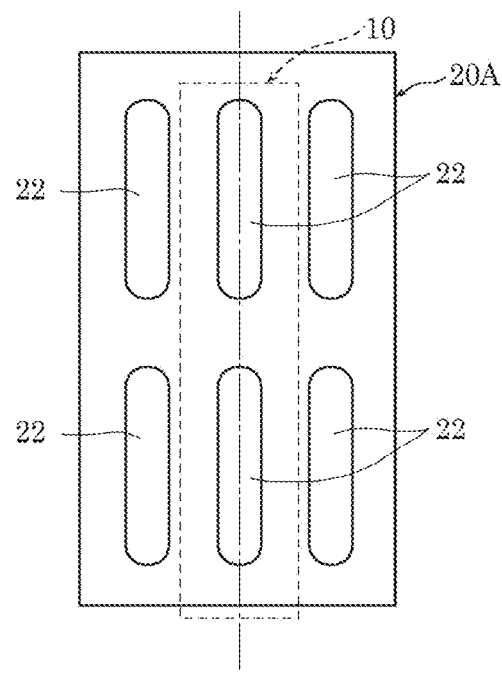
FIG. 21 is a bottom view of the submount of the semiconductor light-emitting apparatus according to the variation of Embodiment 1.

Hereinafter, with reference to FIGS. 20 and 21, semiconductor light-emitting apparatus 1A according to a variation of Embodiment 1 is described. FIG. 20 is a cross-sectional view and illustrates a configuration of semiconductor light-emitting apparatus 1A according to the variation of Embodiment 1. FIG. 21 is a bottom view of submount 20A of semiconductor light-emitting apparatus 1A. Semiconductor laser 10 is disposed on the side opposite to the bottom of submount main body 21, near which spacer 22 is disposed. That is, semiconductor laser 10 is disposed near first main surface 21a opposite to second main surface 21b. FIG. 21 illustrates the positions of spacers 22 and the position of semiconductor laser 10. Submount main body 21 is between semiconductor laser 10 and spacers 22.

As illustrated in FIGS. 20 and 21, in semiconductor light-emitting apparatus 1A according to the variation, semiconductor laser 10 and at least one of spacers 22 of submount 20 overlap each other in plan view.

Specifically, in the variation, a total of six spacers 22 are provided, two spacers 22 being arranged in the longitudinal direction of submount 20A, and three spacers 22 being arranged in the transverse direction of submount 20A. As illustrated in FIG. 21, when submount 20A is viewed in the normal direction of second main surface 21b of submount main body 21, each of spacers 22 disposed in the center in the transverse direction of submount 20A overlaps semiconductor laser 10.

When spacer 22 and semiconductor laser 10 overlap each other in this manner, a heat dissipation path from semiconductor laser 10, which is a heat source, to spacer 20 passes through submount main body 21 at the shortest distance between first main surface 21a and second main surface 21b. Thus, semiconductor light-emitting apparatus 1A according the variation has lower thermal resistance than semiconductor light-emitting apparatus 1 according to Embodiment 1.

Figure 22:
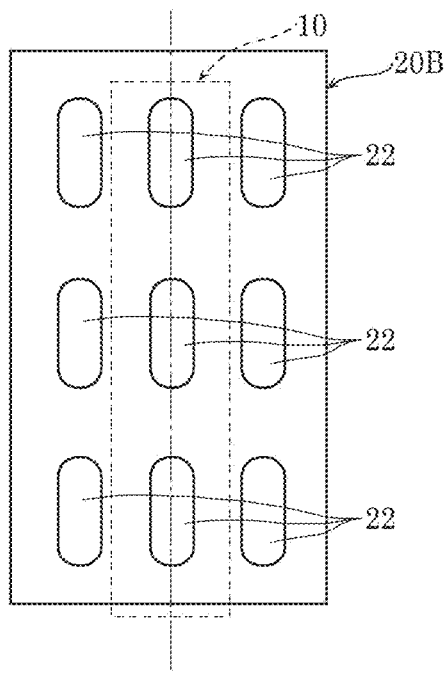
FIG. 22 is a bottom view of another example of the submount of the semiconductor light-emitting apparatus according to the variation of Embodiment 1.
Figure 23:
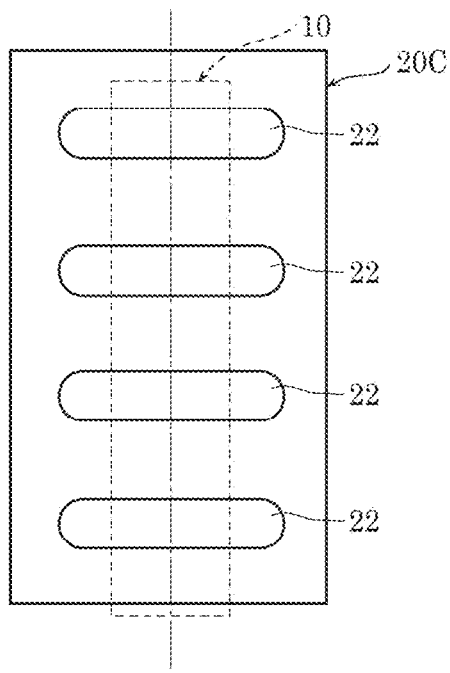
FIG. 23 is a bottom view of still another example of the submount of the semiconductor light-emitting apparatus according to the variation of Embodiment 1.
Figure 24:
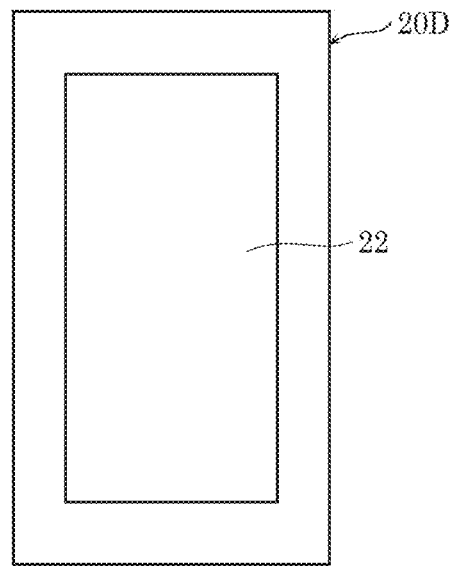
FIG. 24 is a bottom view of still another example of the submount of the semiconductor light-emitting apparatus according to the variation of Embodiment 1.
Figure 25:
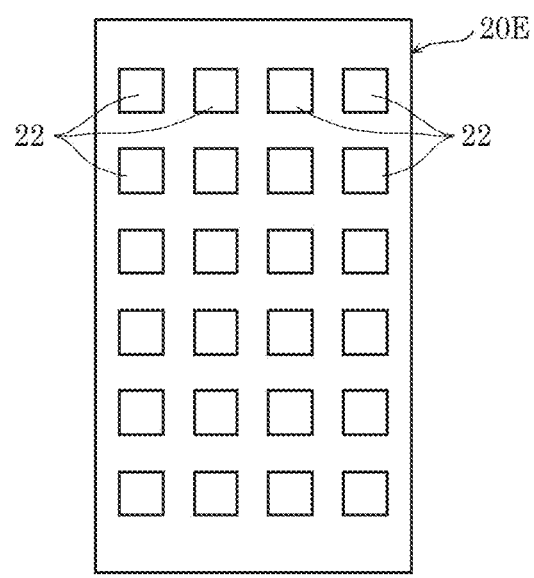
FIG. 25 is a bottom view of still another example of the submount of the semiconductor light-emitting apparatus according to the variation of Embodiment 1.

It should be noted that spacers 22 are not limited to nine spacers 22. For instance, as with submount 20B in FIG. 22, a total of six spacers 22 may be provided, three spacers 22 being arranged in the longitudinal direction of submount 20B, and three spacers 22 being arranged in the transverse direction of submount 20B. As with submount 20C in FIG. 23, four oblong spacers 22 may be arranged in the longitudinal direction of submount 20C. As with submount 20D in FIG. 24, one large rectangular spacer 22 may be formed. As with submount 20E in FIG. 25, a total of 24 spacers 22 may be provided, six small rectangular spacers 22 being arranged in the longitudinal direction of submount 20E, and four small rectangular spacers 22 being arranged in the transverse direction of submount 20E.

Embodiment 2

Figure 26:
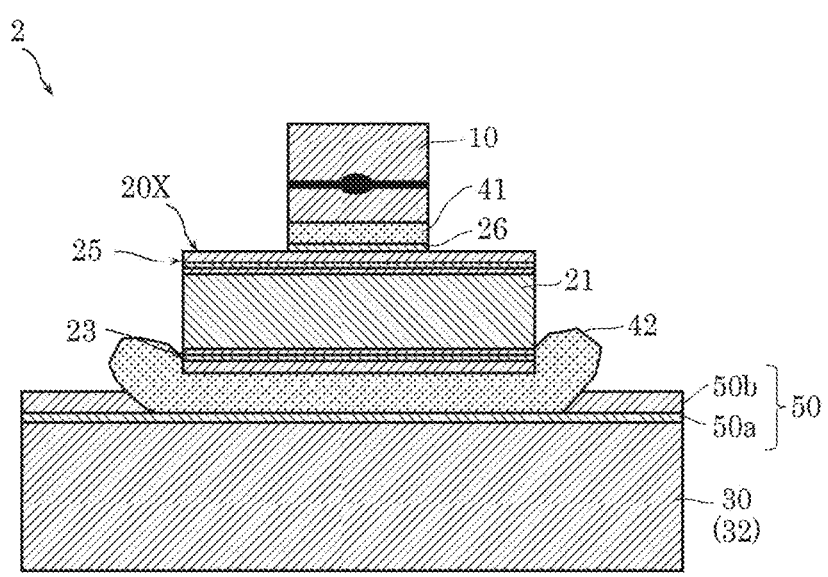
FIG. 26 is a cross-sectional view and illustrates a configuration of a semiconductor light-emitting apparatus according to Embodiment 2.

Hereinafter, with reference to FIG. 26, semiconductor light-emitting apparatus 2 according to Embodiment 2 is described. FIG. 26 is a cross-sectional view and illustrates a configuration of semiconductor light-emitting apparatus 2 according to Embodiment 2.

Semiconductor light-emitting apparatus 2 according to Embodiment 2 and semiconductor light-emitting apparatus 1 according to Embodiment 1 are different in terms of the configuration of submount 20X and the thickness of surface layer 50b of metal film 50.

Specifically, spacer 22 and second metal film 24, which are provided in submount 20 in Embodiment 1, are not provided in submount 20X in Embodiment 2. Surface layer 50b of metal film 50 has a thickness greater than or equal to 1 μm. Surface layer 50b, which is the surface layer of metal film 50, is a gold layer only made of gold or a layer including gold.

Through an experiment, the inventors of the present application found that even without providing spacer 22 in submount 20, it is possible to control the thickness of second bonding material 42 by thickening surface layer 50b formed on the outermost surface of substrate 30. Hereinafter, the experiment is described.

Figure 27:
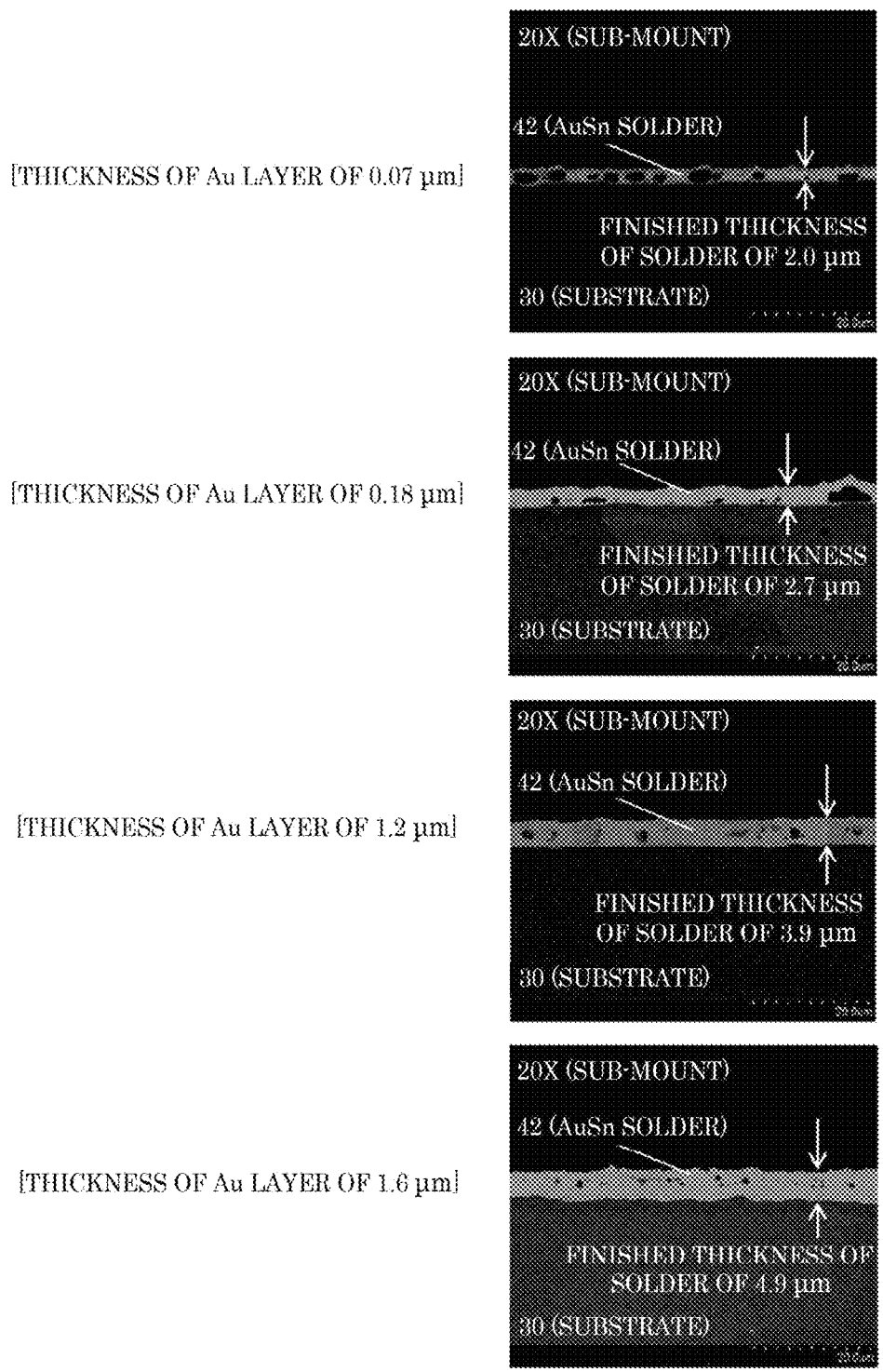
FIG. 27 includes SEM cross-section images showing the results of an experiment conducted in Embodiment 2.
Figure 28:
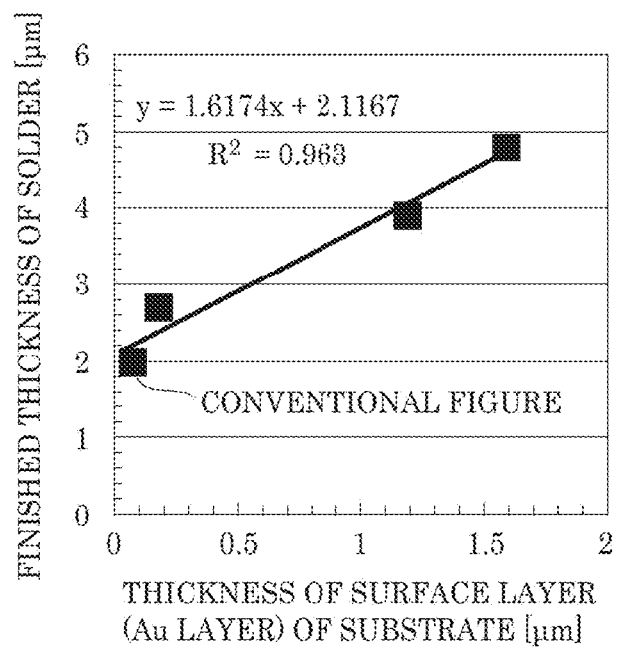
FIG. 28 illustrates a relationship between the thickness of a surface layer (Au layer) and the thickness of a second bonding material (finished thickness of solder), the relationship having been obtained in the experiment conducted in Embodiment 2.

In the experiment, the inventors measured the thickness of second bonding material 42 (finished thickness of solder) that has changed with changes in the thickness of surface layer 50b made of an Au layer. The thickness of surface layer 50b was changed from 0.07 μm to 0.18 μm to 1.2 μm to 1.6 μm. FIG. 27 includes SEM cross-section images showing the results of the experiment. FIG. 28 illustrates a relationship between the thickness of surface layer 50b (Au layer) and the thickness of second bonding material 42 (finished thickness of solder), the relationship having been obtained through the experiment. It should be noted that surface layer 50b made of the Au layer was formed by gold plating.

As illustrated in FIGS. 27 and 28, by thickening surface layer 50b (Au layer), it is possible to thicken second bonding material 42 (increase finished thickness of solder). That is, by controlling the thickness of surface layer 50b, it is possible to control the thickness of second bonding material 42. In this case, when surface layer 50b has a thickness greater than or equal to 1 μm, second bonding material 42 can have a thickness greater than or equal to 3.5 μm.

In addition, as illustrated in FIG. 27, by thickening surface layer 50b (Au layer), it is possible to reduce the size of each void in second bonding material 42.

In semiconductor light-emitting apparatus 1 according to Embodiment 1, the thickness of second bonding material 42 is controlled and set to a proper value by providing spacer 22 in submount 20. Meanwhile, in semiconductor light-emitting apparatus 2 according to Embodiment 2, the thickness of second bonding material 42 is controlled by controlling the thickness of surface layer 50b formed on the outermost surface of substrate 30.

Hereinafter, the fact that second bonding material 42 can be thicken by controlling the thickness of surface layer 50b is described while describing the method of fabricating semiconductor light-emitting apparatus 2 according to Embodiment 2 with reference to FIGS. 29A to 29C.

Figure 29A:
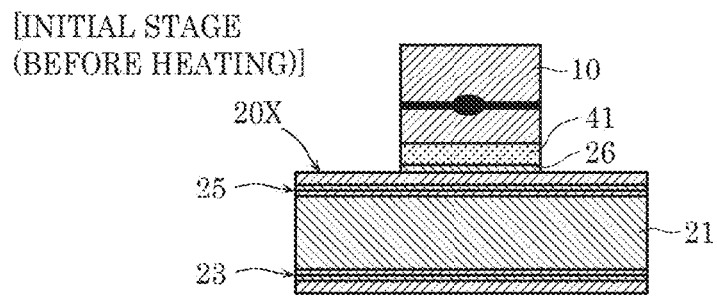
FIG. 29A illustrates mounting of a submount, above which a semiconductor laser is mounted, above a substrate (before heating) in the method of fabricating the semiconductor light-emitting apparatus according to Embodiment 2.

As illustrated in FIG. 29A, second bonding material 42 is disposed on the surface of substrate 30 (specifically, surface of surface layer 50b). Here, before mounting submount 20X, above which semiconductor laser 10 is mounted, above substrate 30 (before heating second bonding material 42), surface layer 50b has a larger area than second bonding material 42.

Figure 29B:
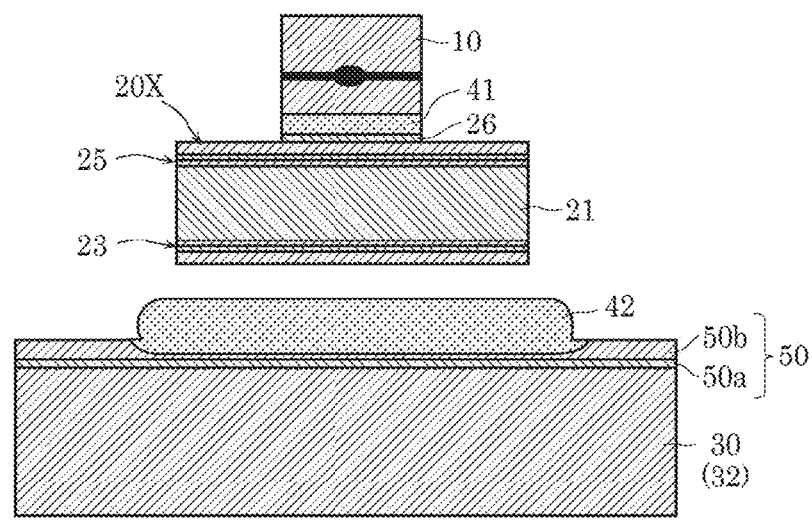
FIG. 29B illustrates the mounting of the submount, above which the semiconductor laser is mounted, above the substrate (when heating) in the method of fabricating the semiconductor light-emitting apparatus according to Embodiment 2.

In this state, when second bonding material 42 is heated with a (not-illustrated) heater and melts, then as illustrated in FIG. 29B, diffusing of Sn from second bonding material 42 into surface layer 50b in the lateral direction stops along the way. Here, a portion of surface layer 50b not reached by the Sn remains a solid.

Figure 29C:
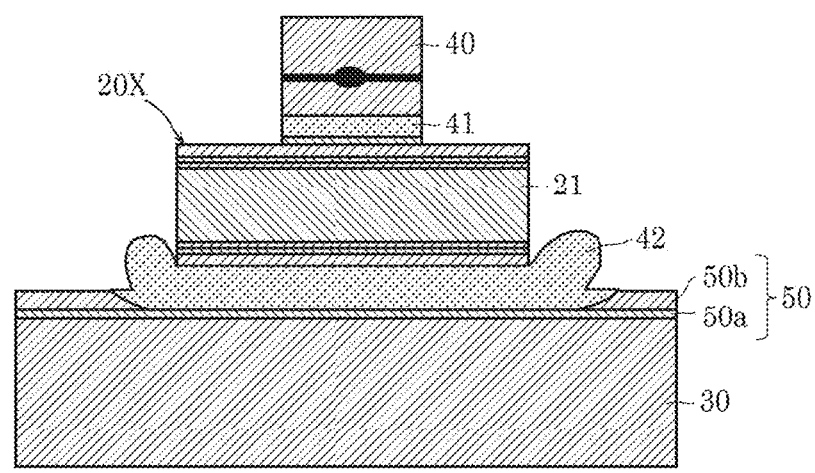
FIG. 29C illustrates the mounting of the submount, above which the semiconductor laser is mounted, above the substrate (when keeping heating and pressing submount) in the method of fabricating the semiconductor light-emitting apparatus according to Embodiment 2.
Figure 30:
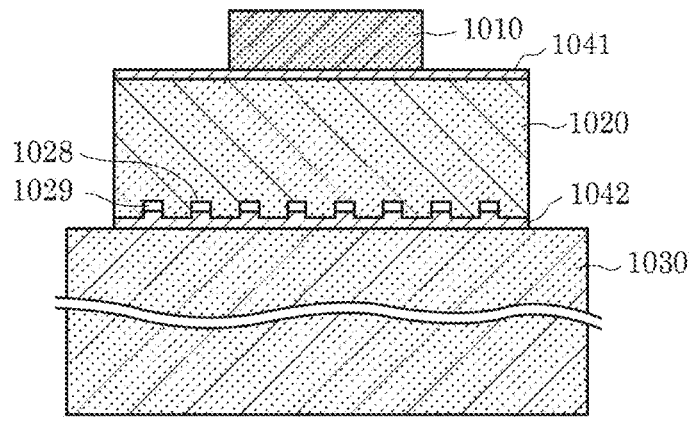
FIG. 30 illustrates a packaging structure of the optical semiconductor device disclosed in PTL 1.
Figure 31:
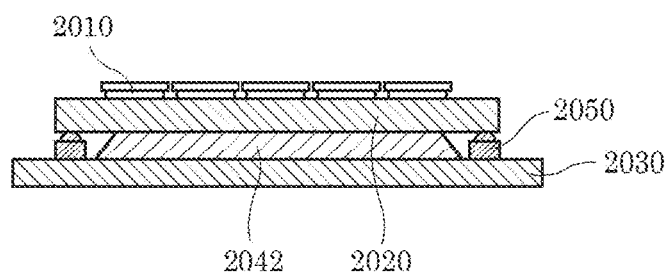
FIG. 31 illustrates a packaging structure of the light-emitting diode module disclosed in PTL 2.
Figure 32:
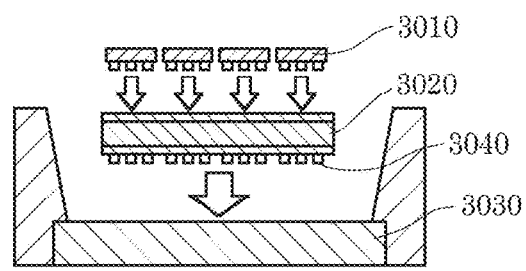
FIG. 32 illustrates a packaging structure of the light-emitting apparatus disclosed in PTL 3.

Then, as illustrated in FIG. 29C, while keeping heating second bonding material 42, submount 20X is pressed against second bonding material 42. Here, to squash the central portion of second bonding material 42, there should be a space in which second bonding material 42 spreads sideways. However, since the Sn is not spread in portions on both sides of second bonding material 42, the portions are in the solid state (Au). That is, second bonding material 42 cannot spread sideways. Thus, surface layer 50b is not squashed so much by submount 20X, and a certain thickness is maintained. That is, by forming thick surface layer 50b, thick second bonding material 42 can be formed.

As discussed above, semiconductor light-emitting apparatus 2 according to Embodiment 2 includes substrate 30, submount 20X above substrate 30, and semiconductor laser 10 above submount 20X. Semiconductor laser 10 and submount 20X are bonded to each other with first bonding material 41. Substrate 30 and submount 20X are bonded to each other with second bonding material 42. As a gold layer or a layer including gold, surface layer 50b having a thickness greater than or equal to 1 μm is formed on the outermost surface of substrate 30. It should be noted that when semiconductor laser 10 is capable of operating in a state in which a difference between power consumption and optical output power is greater than or equal to 3 W, greater effects of the present disclosure are obtained.

As with semiconductor light-emitting apparatus according to Embodiment 1, in semiconductor light-emitting apparatus 2 according to Embodiment 2, the following Expressions 1 and 2 are satisfied, where d (m) is the average thickness of second bonding material 42, ΔT (K) is a temperature change range ensured in semiconductor light-emitting apparatus 2, $\alpha_{sub}$ (K$^{-1}$) is the thermal expansion coefficient of the base material (submount main body 21) of submount 20X, $\alpha_{stem}$ (K$^{-1}$) is the thermal expansion coefficient of substrate 30, Z (GPa) is the modulus of elasticity of second bonding material 42, W (m) is the width of submount 20X, L (m) is the length of submount 20X, and C (GN/m) is the crack-occurrence critical constant of second bonding material 42.

[Math. 14]

$$\Delta T \cdot (a_{stem} - a_{sub}) \cdot Z \cdot \left( \frac{\frac{W}{2} \cdot \frac{L}{2}}{d} \right) \leq C \quad \text{(Expression 1)}$$

[Math. 15]

$$C = 3 \times 10^{-3} \quad \text{(Expression 2)}$$

Thus, it is possible to accurately obtain the thickness of second bonding material 42 that ensures sufficient strength against thermal strain caused by a temperature cycle. In Embodiment 2, submount 20X does not have spacer 22, and the surface of submount 20X near substrate 30 is flat. Thus, it is possible to easily interpose second bonding material 42 between submount 20X and substrate 30 without a gap. Accordingly, it is possible to fabricate semiconductor light-emitting apparatus 2 that has sufficient strength against thermal strain caused by the temperature cycle and in which an increase in thermal resistance is suppressed.

(Other Variation)

The semiconductor light-emitting apparatuses according to the present disclosure are described on the basis of Embodiments 1 and 2. However, the present disclosure is not limited to the descriptions in Embodiments 1 and 2.

For instance, in Embodiment 1, by providing spacer 22 in submount 20 and in Embodiment 2, by thickening surface layer 50b on the outermost surface of substrate 30, it is possible to fabricate a semiconductor light-emitting apparatus that has sufficient strength against thermal strain caused by the temperature cycle and in which an increase in thermal resistance is suppressed, specifically, a semiconductor light-emitting apparatus that meets the reliability test standard AEC-Q102 for vehicle components. However, the semiconductor light-emitting apparatus of the present disclosure is not limited to the examples.

Specifically, a semiconductor light-emitting apparatus may meet the following Expressions 1 and 2 by meeting the following conditions. A decrease of optical output power for an operating current If after a temperature cycle test is at most 20% of optical output power for the operating current If before the temperature cycle test. Here, in the temperature cycle test, a temperature cycle from 125 degrees Celsius to negative 40 degrees Celsius is repeated 1,000 times in semiconductor laser 10 that operates in a state in which a difference between power consumption and optical output power is greater than or equal to 3 W. Second main surface 21b of submount main body 21 has an area greater than or equal to 0.6 mm$^2$. First bonding material 41 has a thickness less than 3 μm.

[Math. 16]

$$\Delta T \cdot (a_{stem} - a_{sub}) \cdot Z \cdot \left( \frac{\frac{W}{2} \cdot \frac{L}{2}}{d} \right) \leq C \quad \text{(Expression 1)}$$

[Math. 17]

$$C = 3 \times 10^{-3} \quad \text{(Expression 2)}$$

Although the semiconductor light-emitting apparatuses in Embodiments 1 and 2 include substrate 30, substrate 30 does not have to be included. For instance, a semiconductor light-emitting apparatus may include submount 20 and semiconductor laser 10. Submount 20 has first main surface 21a and second main surface 21b. Semiconductor laser 10 is disposed near first main surface 21a of submount 20. In this case, semiconductor laser 10 and submount 20 are bonded to each other with first bonding material 41. Second main surface 21b of submount 20 has first region R1 on which spacer 22 is disposed and second region R2 without spacer 22. Thus, without special consideration, it is possible to bond substrate 30 and submount 20 to each other by the method discussed in Embodiment 1. Thus, it is possible to easily ensure both high resistance to the temperature cycle and high performance of heat dissipation.

The present disclosure includes an embodiment obtained by making various changes envisioned by those skilled in the art to the above embodiments and variations and an embodiment obtained through any combination of the structural elements and the functions described in the above embodiments and variations without departing from the spirit of the present disclosure.

INDUSTRIAL APPLICABILITY

A semiconductor light-emitting apparatus according to an aspect of the present disclosure can be used as the light sources of products in various fields, such as an optical disk, a display, a vehicle headlamp, an illuminator, and laser machining equipment, and is useful especially as the light source of a vehicle component used in an environment subjected to a large temperature change.

REFERENCE MARKS IN THE DRAWINGS 1, 1A, 2, 100 semiconductor light-emitting apparatus
10 semiconductor laser
11 semiconductor substrate
12 n-type semiconductor layer
13 active layer
14 p-type semiconductor layer
15 insulating layer
16 p-side electrode
16a Pd layer
16b Pt layer
16c Au layer
17 n-side electrode
17a Ti layer
17b Pt layer
17c Au layer
18 adhesion assisting layer
18a Ti layer
18b Pt layer
19 Au layer
20, 20A, 20B, 20C, 20D, 20E, 20X submount
21 submount main body
21a first main surface
21b second main surface
22 spacer
23 first metal film
23a first adhesion layer
23b barrier layer
23c deterioration prevention layer
24 second metal film
24a second adhesion layer
24b barrier layer
24c surface layer
25 third metal film
25a third adhesion layer
25b barrier layer
25c surface layer
26 fourth metal film
30 substrate
31 stem base
32 stem post
33 lead pin
41 first bonding material
42 second bonding material
50 metal film
50a ground layer
50b surface layer
110 cap
111 flat glass
1010 optical semiconductor device chip
1020 submount
1028 groove
1029 cavity
1030 heat dissipation block
1042 bonding material
2010 chip
2020 wiring substrate
2030 heat dissipation substrate
2042 bonding material
2050 supporter
3010 light-emitting device
3020 ceramic substrate
3030 mounting substrate
3040 metal bump

What is claimed is:
1. A semiconductor light-emitting apparatus, comprising:
a substrate;
a submount above the substrate; and
a semiconductor light-emitting device above the submount, wherein:
the semiconductor light-emitting device and the submount are bonded to each other with a first bonding material,
the substrate and the submount are bonded to each other with a second bonding material, the submount has a portion facing the substrate,
the submount includes a submount main body,
the submount main body is provided with a spacer made of a metal or a metal alloy,
the second bonding material has a thickness less than or equal to 10 µm,

[Math. 1]

$$\Delta T \cdot (\alpha_{stem} - \alpha_{sub}) \cdot Z \cdot \left( \frac{\frac{W}{2} \cdot \frac{L}{2}}{d} \right) \leq C \quad \text{(Expression 1)}$$

and

[Math. 2]

$$C = 3 \times 10^{-3} \quad \text{(Expression 2)}$$

are satisfied, where
d (m) is an average thickness of the second bonding material,
ΔT (K) is a temperature change range ensured in the semiconductor light-emitting apparatus,
$\alpha_{sub}$ (K$^{-1}$) is a thermal expansion coefficient of the submount main body,
$\alpha_{stem}$ (K$^{-1}$) is a thermal expansion coefficient of the substrate,
Z (GPa) is a modulus of elasticity of the second bonding material,
W (m) is a width of the submount main body,
L (m) is a length of the submount main body, and
C (GN/m) is a crack-occurrence critical constant of the second bonding material,
the submount has a portion facing the substrate, the portion having a first region on which the spacer is disposed and a second region without the spacer,
the submount is bonded to the substrate by covering at least a portion of the second region with the second bonding material, and a first metal film is disposed on a surface of the submount main body near the substrate.

2. The semiconductor light-emitting apparatus according to claim 1,
wherein the second bonding material in plan view extends outwardly from the submount on the substrate.

3. The semiconductor light-emitting apparatus according to claim 2,
wherein the second bonding material covers at least a portion of a side of the submount.

4. The semiconductor light-emitting apparatus according to claim 1,
wherein a decrease of optical output power for an operating current If after a temperature cycle test is at most 20% of optical output power for the operating current If before the temperature cycle test, the temperature cycle test being a test in which a temperature cycle from 125 degrees Celsius to negative 40 degrees Celsius is repeated 1,000 times.

5. The semiconductor light-emitting apparatus according to claim 1,
wherein the semiconductor light-emitting device is a semiconductor laser, and
the semiconductor laser operates in a state in which a difference between power consumption and optical output power in the semiconductor laser is greater than or equal to 3 W.

6. The semiconductor light-emitting apparatus according to claim 1,
wherein the first bonding material has a thickness less than 3 μm.

7. The semiconductor light-emitting apparatus according to claim 1,
wherein the spacer is made of a metal selected from the group consisting of Cu, Al, Au, and Ag or a metal alloy including at least one of Cu, Al, Au, or Ag.

8. The semiconductor light-emitting apparatus according to claim 1, wherein
two or more spacers are provided to the submount main body, and
the second bonding material fills a space between the two or more spacers.

9. The semiconductor light-emitting apparatus according to claim 1, wherein the submount main body is an insulator.

10. The semiconductor light-emitting apparatus according to claim 1, wherein the spacer is surrounded by the second bonding material.

11. The semiconductor light-emitting apparatus according to claim 1, wherein the first metal film is present between a bottom surface of the submount main body and the spacer.

12. The semiconductor light-emitting apparatus according to claim 1, wherein the first metal film is disposed on the second region.

13. A semiconductor light-emitting apparatus, comprising:
a substrate;
a submount above the substrate; and
a semiconductor light-emitting device above the submount, wherein:
the semiconductor light-emitting device and the submount are bonded to each other with a first bonding material,
the substrate and the submount are bonded to each other with a second bonding material, the submount has a portion facing the substrate,
the submount includes a submount main body,

[Math. 1]
$$\Delta T \cdot (\alpha_{stem} - \alpha_{sub}) \cdot Z \cdot \left(\frac{\frac{W}{2} \cdot \frac{L}{2}}{d}\right) \leq C \text{ and} \quad \text{(Expression 1)}$$

[Math. 2]
$$C = 3 \times 10^{-3} \quad \text{(Expression 2)}$$

are satisfied, where
d (m) is an average thickness of the second bonding material,
ΔT (K) is a temperature change range ensured in the semiconductor light-emitting apparatus,
$\alpha_{sub}$ (K$^{-1}$) is a thermal expansion coefficient of the submount main body,
$\alpha_{stem}$ (K$^{-1}$) is a thermal expansion coefficient of the substrate,
Z (GPa) is a modulus of elasticity of the second bonding material,
W (m) is a width of the submount main body,
L (m) is a length of the submount main body, and
C (GN/m) is a crack-occurrence critical constant of the second bonding material,
a first metal film is disposed on a surface of the submount main body near the substrate, and
the first metal film has a first adhesion layer and a deterioration prevention layer, the first adhesion layer and the deterioration prevention layer being disposed sequentially from the surface of the submount main body.

14. The semiconductor light-emitting apparatus according to claim 13,
wherein the submount has a portion facing the substrate, the portion having a first region on which a spacer is disposed and a second region without the spacer, and
the submount is bonded to the substrate by covering at least a portion of the second region with the second bonding material.

15. The semiconductor light-emitting apparatus according to claim 14,
wherein the submount main body is provided with the spacer.

16. The semiconductor light-emitting apparatus according to claim 15,
wherein the submount main body is provided with spacers each of which is the spacer.

17. The semiconductor light-emitting apparatus according to claim 15,
wherein the submount main body is cuboid,
the submount main body is provided with at least four spacers each of which is the spacer, and
four spacers among the at least four spacers are disposed near four corners of the submount main body.

18. The semiconductor light-emitting apparatus according to claim 15,
wherein a surface of the submount main body near the substrate has a corner without the spacer.

19. The semiconductor light-emitting apparatus according to claim 15,
wherein a side of the spacer is apart from a side of the submount main body.

20. The semiconductor light-emitting apparatus according to claim 15,
wherein a central portion of the spacer is thicker than a peripheral portion of the spacer.

21. The semiconductor light-emitting apparatus according to claim 15,
wherein the spacer has a first surface, a second surface, and a third surface, the first surface facing a surface of the submount main body near the substrate, the second surface being opposite to the first surface, and the third surface being a side between the first surface and the second surface.

22. The semiconductor light-emitting apparatus according to claim 21,
wherein a second metal film is disposed on the second surface.

23. The semiconductor light-emitting apparatus according to claim 14,
wherein the spacer has a minimum width greater than or equal to 50 μm.

24. The semiconductor light-emitting apparatus according to claim 14,
wherein the second bonding material is made of AuSn, and

[Math. 3]

$$\Delta T \cdot (\alpha_{stem} - \alpha_{sub}) \cdot \left(\frac{\frac{W}{2} \cdot \frac{L}{2}}{d}\right) \leq D \quad \text{(Expression 3)}$$

and

[Math. 4]

$$D = 1.32 \times 10^{-4} \quad \text{(Expression 4)}$$

are satisfied, where
D (m) is a crack-occurrence critical constant of the second bonding made of the AuSn.

25. The semiconductor light-emitting apparatus according to claim 14,
wherein a main ingredient of the spacer is a metal selected from Cu, Al, Au, and Ag or an alloy including at least one of Cu, Al, Au, and Ag.

26. A semiconductor light-emitting apparatus, comprising:
a substrate;
a submount above the substrate; and
a semiconductor light-emitting device above the submount, wherein
the semiconductor light-emitting device and the submount are bonded to each other with a first bonding material,
the substrate and the submount are bonded to each other with a second bonding material, the submount has a portion facing the substrate,
the submount includes a submount main body,

[Math. 1]

$$\Delta T \cdot (\alpha_{stem} - \alpha_{sub}) \cdot Z \cdot \left(\frac{\frac{W}{2} \cdot \frac{L}{2}}{d}\right) \leq C \quad \text{and} \quad \text{(Expression 1)}$$

[Math. 2]

$$C = 3 \times 10^{-3} \quad \text{(Expression 2)}$$

are satisfied, where
d (m) is an average thickness of the second bonding material,
ΔT (K) is a temperature change range ensured in the semiconductor light-emitting apparatus,
$\alpha_{sub}$ (K$^{-1}$) is a thermal expansion coefficient of the submount main body,
$\alpha_{stem}$ (K$^{-1}$) is a thermal expansion coefficient of the substrate,
Z (GPa) is a modulus of elasticity of the second bonding material,
W (m) is a width of the submount main body,
L (m) is a length of the submount main body, and
C (GN/m) is a crack-occurrence critical constant of the second bonding material,
the submount has a portion facing the substrate, the portion having a first region on which a spacer is disposed and a second region without the spacer,
the submount is bonded to the substrate by covering at least a portion of the second region with the second bonding material,
depressions are formed on a surface of the substrate, and
the spacer has a thickness greater than a depth of each of the depressions.

27. A semiconductor light-emitting apparatus, comprising:
a substrate;
a submount above the substrate; and
a semiconductor light-emitting device above the submount,
wherein the semiconductor light-emitting device and the submount are bonded to each other with a first bonding material,
the substrate and the submount are bonded to each other with a second bonding material, the submount has a portion facing the substrate,
the submount includes a submount main body,
the submount main body is provided with a spacer made of metal or a metal alloy,
the second bonding material has a thickness less than or equal to 10 μm,

[Math. 1]

$$\Delta T \cdot (\alpha_{stem} - \alpha_{sub}) \cdot Z \cdot \left(\frac{\frac{W}{2} \cdot \frac{L}{2}}{d}\right) \leq C \quad \text{and} \quad \text{(Expression 1)}$$

[Math. 2]

$$C = 3 \times 10^{-3} \quad \text{(Expression 2)}$$

are satisfied, where
d (m) is an average thickness of the second bonding material,
ΔT (K) is a temperature change range ensured in the semiconductor light-emitting apparatus,
$\alpha_{sub}$ (K$^{-1}$) is a thermal expansion coefficient of the submount main body,
$\alpha_{stem}$ (K$^{-1}$) is a thermal expansion coefficient of the substrate,
Z (GPa) is a modulus of elasticity of the second bonding material,
W (m) is a width of the submount main body,
L (m) is a length of the submount main body, and
C (GN/m) is a crack-occurrence critical constant of the second bonding material, the submount has a portion facing the substrate, the portion having a first region on which a spacer is disposed and a second region without the spacer, the submount is bonded to the substrate by covering at least a portion of the second region with the second bonding material, the spacer has a first surface, a second surface, and a third surface, the first surface facing a surface of the submount main body near the substrate, the second surface being opposite to the first surface, and the third surface being a side between the first surface and the second surface, and a metal film is disposed on the second surface.

* * * * *